United States Patent
Nagamatsu et al.

(10) Patent No.: US 8,440,915 B2
(45) Date of Patent: May 14, 2013

(54) DEVICE MOUNTING BOARD AND SEMICONDUCTOR MODULE

(75) Inventors: Masayuki Nagamatsu, Mizuho (JP); Kiyoshi Shibata, Gifu (JP); Takanori Hayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 379 days.

(21) Appl. No.: 12/915,852

(22) Filed: Oct. 29, 2010

(65) Prior Publication Data
US 2011/0100696 A1    May 5, 2011

(30) Foreign Application Priority Data

Oct. 30, 2009    (JP) .................................. 2009-251466
Nov. 30, 2009    (JP) .................................. 2009-272855

(51) Int. Cl.
*H05K 1/11*    (2006.01)
(52) U.S. Cl.
USPC .......................................... 174/261; 361/772
(58) Field of Classification Search .................. 174/261; 361/772–776; 29/842–845
See application file for complete search history.

(56) References Cited

U.S. PATENT DOCUMENTS 7,043,830 B2 *   5/2006   Farnworth .................. 29/842

FOREIGN PATENT DOCUMENTS

| JP | 2009-099637 | 5/2009 |
|---|---|---|
| JP | 2009-238984 | 10/2009 |

* cited by examiner

*Primary Examiner* — Jeremy Norris
(74) *Attorney, Agent, or Firm* — McDermott Will & Emery LLP

(57) ABSTRACT

A semiconductor device is of a PoP structure such that first electrode portions provided on a first device mounting board constituting a first semiconductor module and second electrode portions provided in a second semiconductor module are joined together by solder balls. A first insulating layer having an opening is provided on one main surface of an insulating resin layer which is a substrate, and an electrode portion, whose top portion protrudes above the top surface of the first insulating layer, is formed in the opening. A second insulating layer is provided on top of the first insulating layer in the periphery of the top portion of the first electrode portion; the second insulting layer is located slightly apart from the top portion of the first electrode portion. The first electrode portion is shaped such that the top portion is formed by a curved surface or formed by a curved surface and a plane surface smoothly connected to the curved surface.

10 Claims, 15 Drawing Sheets

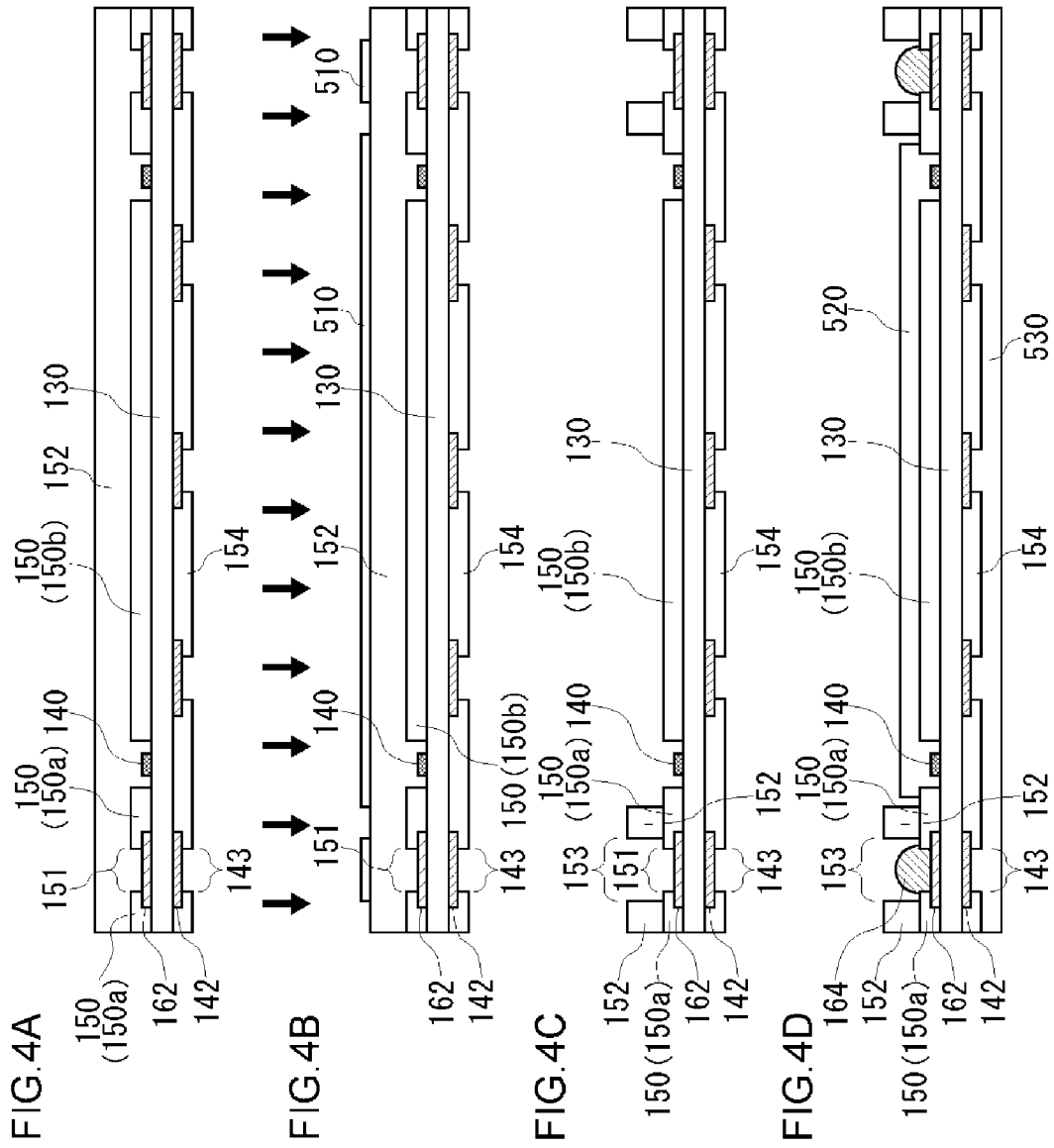

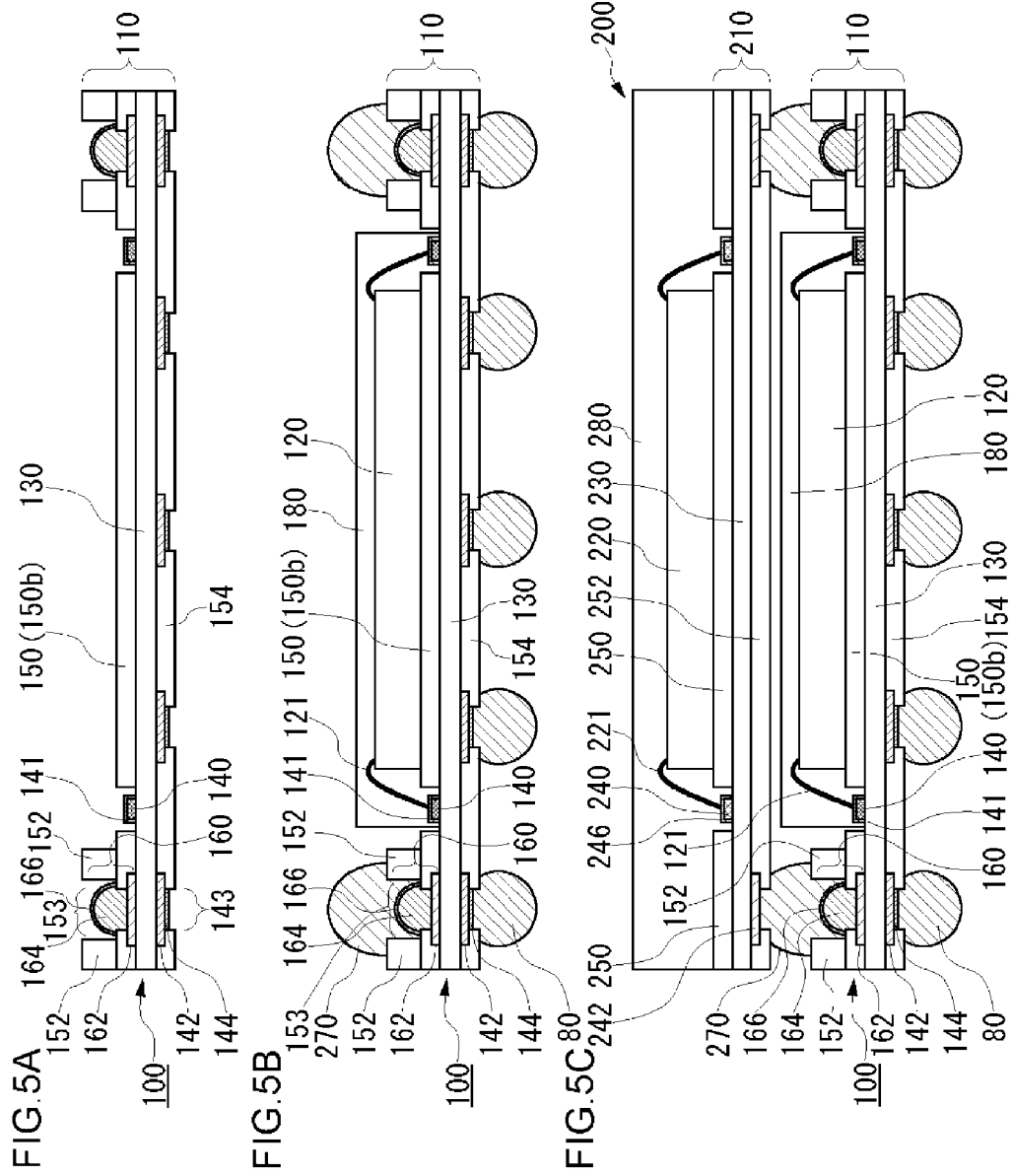

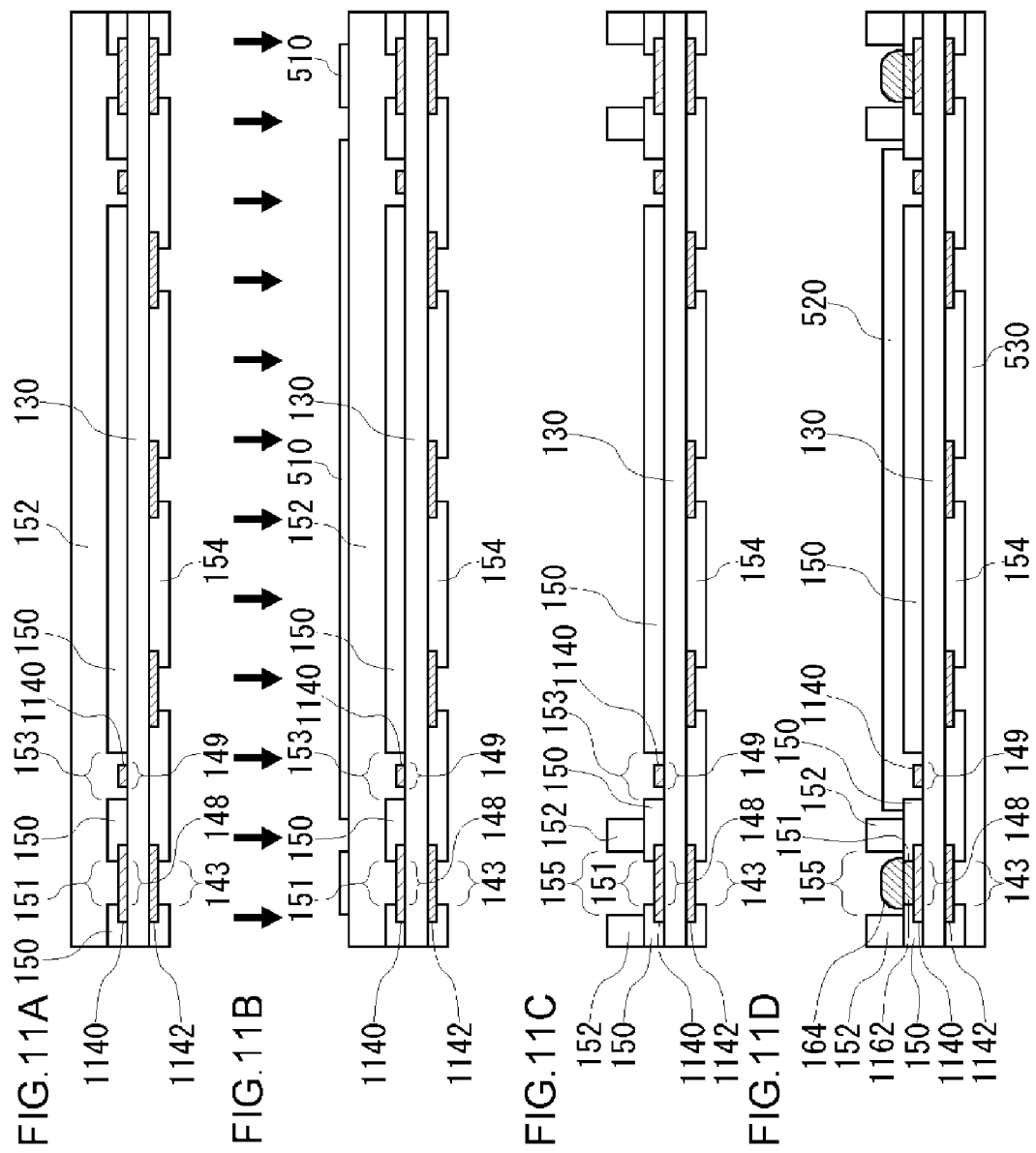

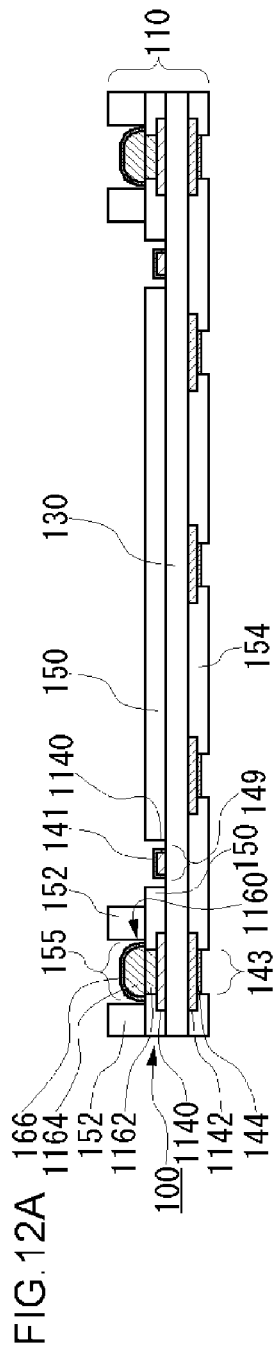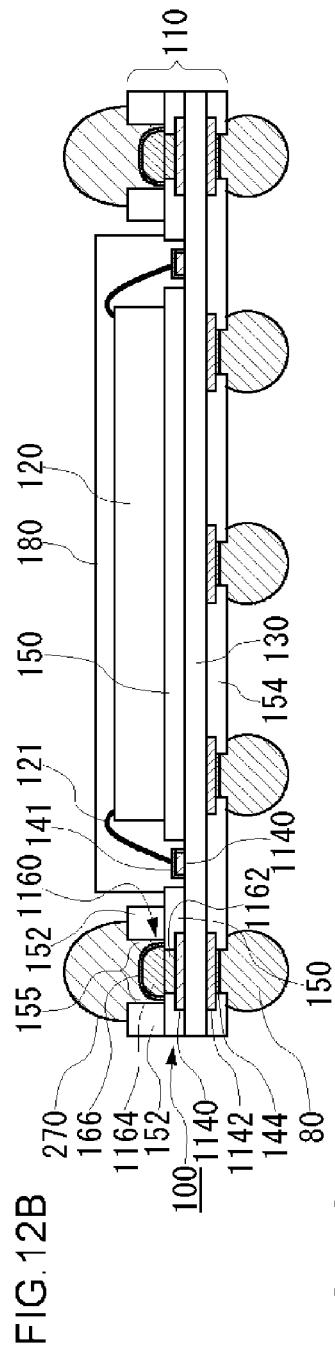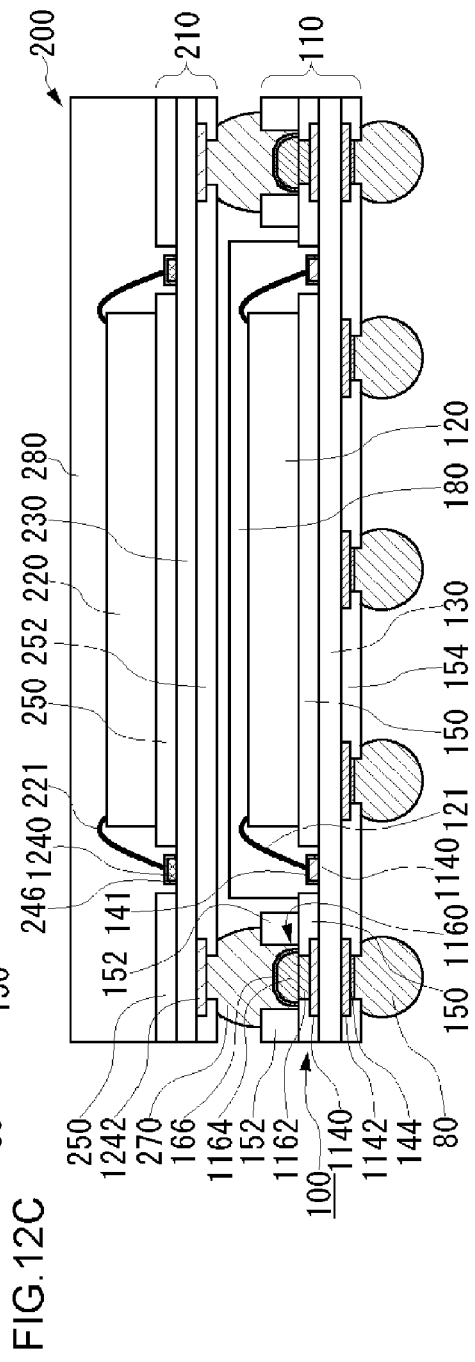

DEVICE MOUNTING BOARD AND SEMICONDUCTOR MODULE

CROSS-REFERENCE TO RELATED APPLICATIONS

This application is based upon and claims the benefit of priority from the prior Japanese Patent Applications No. 2009-251466, filed on Oct. 30, 2009, and Japanese Patent Application No. 2009-272855, filed on Nov. 30, 2009, the entire contents of which are incorporated herein by reference.

BACKGROUND OF THE INVENTION

1. Field of the Invention

The present invention relates to a device mounting board used to mount semiconductor devices thereon, a semiconductor module and a mobile apparatus.

2. Description of the Related Art

In recent years, with miniaturization and higher performance in electronic devices, demand has been ever greater for further miniaturization and higher density of semiconductor devices used in the electronic devices. In response to such demand, widely known is a semiconductor module stacking technique such as a 3D packaging technique which is called a package-on-package (PoP) where two or more packages are installed on top of one another.

When semiconductor modules are to be stacked together, a method is employed where an electrode pad provided on a substrate of a lower-side semiconductor module is connected to an electrode pad provided on a back side of an upper-side module using bonding members such as solder balls. Known as connection structures using the solder balls are, for example, a structure where solder balls are connected on a flat electrode pad and a structure where solder balls are connected to an electrode pad having a stepped portion. Also known is an electrode structure of non-solder-mask-defined (NSMD) type where there is a clearance between an electrode pad and a solder mask (insulating layer).

In the structure where the bonding members such as solder balls are mounted on the flat electrode pad (electrode portions), the problem of weak joint strength relative to the force acting along a horizontal direction needs to be addressed. In the structure where there is provided a stepped portion in the electrode pad, there is a problem where the stress tends to be concentrated in corners (edges) of the electrode pad and cracks are likely to occur between the solder balls and the electrode pad.

In the conventional electrode structure of NSMD type, the leader lines connected to the electrode pad are exposed. Thus the problem of a likelihood of disconnection of the leader lines with the stress applied thereto needs to be addressed.

SUMMARY OF THE INVENTION

The present invention has been made in view of the foregoing circumstances, and a purpose thereof is to provide a technology by which to improve the connection reliability between electrodes and connection members such as solder balls in a device mounting board.

One embodiment of the present invention relates to a device mounting board. The device mounting board comprises: a substrate; a first insulating layer, provided on one main surface of the substrate, having an opening; an electrode portion, provided in the opening, having a top portion protruding above a top surface of the first insulating layer; and a second insulating layer provided on top of the first insulating layer in a periphery of the top portion of the electrode portion, the second insulting layer being located apart from the top portion of the electrode portion, wherein the electrode portion is shaped such that the top portion of the electrode portion is formed by a curved surface or formed by a curved surface and a plane surface smoothly connected to the curved surface.

By employing this embodiment, the top portion of the electrode portion does not have sharp corners where the stress otherwise tends to be concentrated. Thus, the stress is less likely to be concentrated on the top portion thereof when the bonding members such as solder balls are joined to the electrode portions. As a result, the connection reliability between the electrode portions and the bonding members can be improved when the bonding members are jointed to the electrode portions.

The top portion of the electrode portion in the above-described embodiment may be semi-spherical in shape. The shape of the top portion of the electrode portion may be domy with an uppermost part of the top portion thereof being flat. The uppermost part of the top portion of the electrode portion may be positioned lower than a top surface of the second insulating layer. The uppermost part of the top portion of the electrode portion may be positioned higher than a top surface of the second insulating layer. The device mounting board according to the above-described embodiments may be used for a semiconductor device having a package-on-package structure.

Another embodiment of the present invention relates to a semiconductor module. The semiconductor module comprises: a device mounting board according to any of the above-described embodiments; and a semiconductor device mounted on one of main surfaces of the substrate.

Still another embodiment of the present invention relates to a portable device. The portable device mounts a semiconductor module according to any of the above-described embodiments.

Still another embodiment of the present invention relates to a device mounting board. The device mounting board comprises: a substrate; a wiring layer provided on one main surface of the substrate; a first insulating layer having an opening where a leading region is exposed, the first insulating layer being so provided as to cover the wiring layer; a leading portion provided in the opening and electrically connected to the wiring layer; an electrode portion electrically connected to the leading portion, the electrode portion protruding above a top surface of the first insulating layer over the opening; and a second insulating layer provided on top of the first insulating layer in a periphery of the top portion of the electrode portion, the second insulting layer being located apart from the electrode portion.

By employing this embodiment, the wiring layer is electrically connected to the electrode portion at a lower part thereof via the leading portion, and the leading portion is not exposed. As a result, the disconnection of the leading portions is suppressed and therefore the connection reliability between the electrode portions and the connection members such as solder balls can be improved.

In the above-described device mounting board, the diameter of the electrode portion may be greater than that of the opening, and a circumferential lower part of the electrode portion may be in contact with the top surface of the first insulating layer. The electrode portion may be used as an external connection terminal. The first insulating layer may have another opening where an electrode region of the wiring layer is exposed, and the electrode region may be used as a connection terminal for use with an electronic component mounted on a side of one main surface of the substrate. The device mounting board according to the above-described embodiments may be used for a semiconductor device having a package-on-package structure.

Still another embodiment of the present invention relates to a semiconductor module. The semiconductor module comprises: a device mounting board according to any of the above-described embodiments; and a semiconductor device mounted on one of main surfaces of the substrate.

Still another embodiment of the present invention relates to a portable device. The portable device mounts the above-described semiconductor module.

It is to be noted that any arbitrary combinations or rearrangement of the aforementioned structural components and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 4A to 4D are cross-sectional views showing a process in a method for fabricating a semiconductor device according to a first embodiment;

FIGS. 5A to 5C are cross-sectional views showing a process in a method for fabricating a semiconductor device according to a first embodiment;

FIGS. 11A to 11D are cross-sectional views showing a process in a method for fabricating a semiconductor device according to a fourth embodiment;

FIGS. 12A to 12C are cross-sectional views showing a process in a method for fabricating a semiconductor device according to a fourth embodiment;

DETAILED DESCRIPTION OF THE INVENTION

Figure 1:
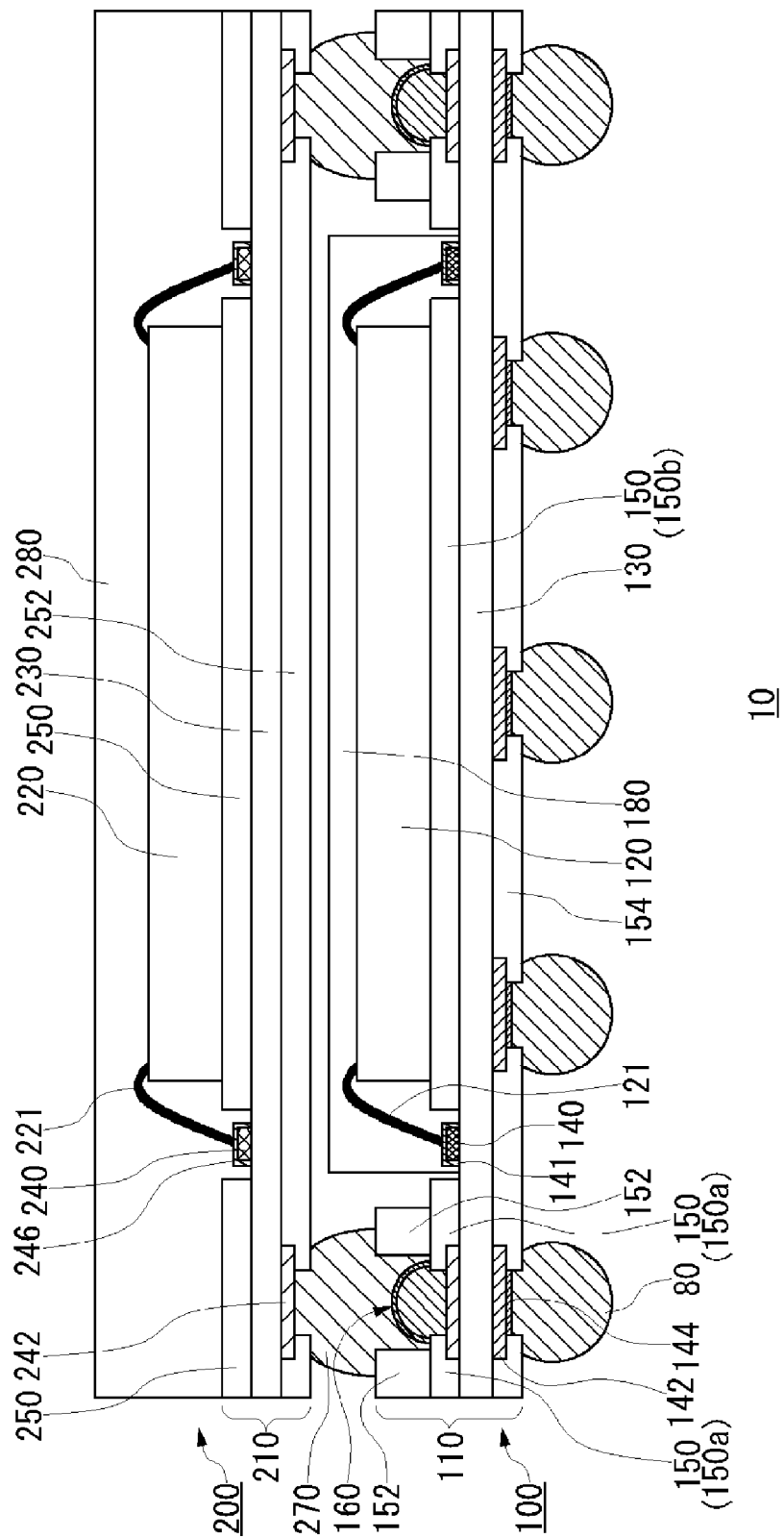
FIG. 1 is a schematic cross-sectional view showing a structure of a semiconductor device according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given to the same components and the description thereof is omitted as appropriate.

First Embodiment

Figure 2:
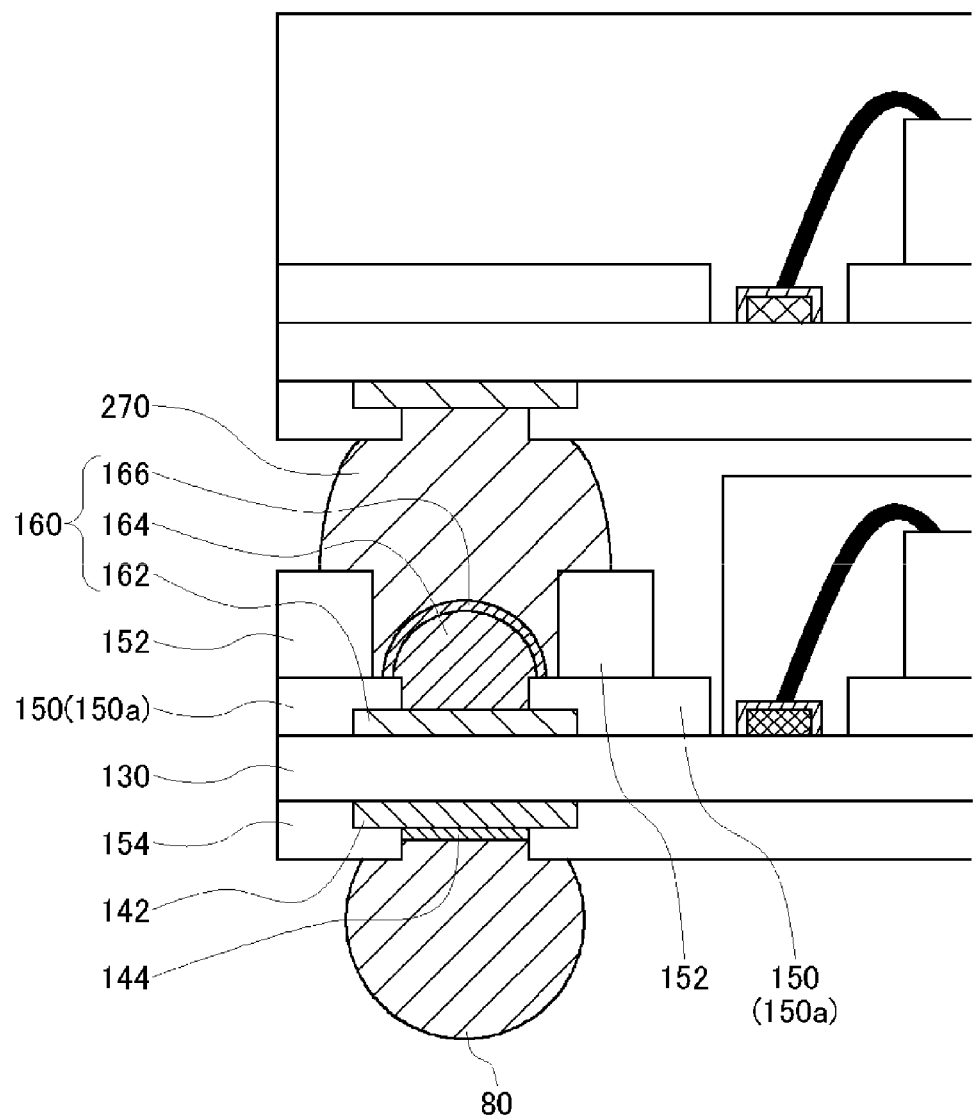
FIG. 2 is a partial enlarged view showing a structure of a first electrode portion in a semiconductor device according to a first embodiment and the periphery of the first electrode portion.

FIG. 1 is a schematic cross-sectional view showing a structure of a semiconductor device 10 according to a first embodiment of the present invention. FIG. 2 is a partial enlarged view showing a structure of a first electrode portion 160 in the semiconductor device 10 and the periphery of the first electrode portion 160. The semiconductor device 10 has a package-on-package (PoP) structure. That is, the semiconductor device 10 includes a first semiconductor module 100 and a second semiconductor module 200 stacked on top of the first semiconductor module 100.

The first semiconductor module 100 is structured such that a first semiconductor device (chip) 120 is mounted on a first device mounting board 10.

The first device mounting board 10 includes an insulating resin layer 130 as a base material, a wiring layer 140 formed on one of main surfaces of the insulating resin layer 130, a third electrode portion 142 formed on the other of main surfaces of the insulating resin layer 130, a first insulating layer 150, and a second insulating layer 152, both the first insulating layer 150 and the second insulating layer 152 being formed on one of main surfaces of the insulating resin layer 130.

The insulating resin layer 130 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like.

The wiring layer 140 of a predetermined pattern is provided on one main surface of the insulating resin layer 130. In the present embodiment, the one main surface of the insulating resin layer 130 is the surface thereof on which the first semiconductor device 120 is placed, and will be referred to as "semiconductor device mounting surface" also. A bonding region in the wiring layer 140 is covered with a gold plating layer 141. The first electrode portion 160 used to join a package mounting solder is provided on one main surface of the insulating resin layer 130. The detail of the first electrode portion 160 will be described later. The third electrode portion 142 of a predetermined pattern is provided on the other main surface of the insulating resin layer 130. A gold plating layer 144 is provided in the surface of the third electrode portion 142. A material that forms the wiring layer 140 and the third electrode portion 142 may be copper, for instance. The thickness of the wiring layer 140 and the thickness of the third electrode portion 142 may each be 20 μm, for instance. Though not shown in FIG. 1 and FIG. 2, there is provided another wiring layer which belongs to the same layer to which the third electrode portion 142 belongs, and this another wiring layer has the same height as that of the third electrode portion 142.

Via conductors (not-shown), which penetrate the insulating resin layer 130, are provided in predetermined positions of the insulating resin layer 130. The via conductor is formed by a plating method using copper, for instance. The first electrode portion 160 and the third electrode portion 142 are electrically connected to each other by the via conductor.

The first insulating layer 150 is provided on one main surface of the insulating resin layer 130. The first insulating layer 150 is divided into a first insulating layer 150a disposed in the periphery of the first electrode portion 160 and a first insulating layer 150b disposed in a semiconductor device mounting region.

The first insulating layer 150a covers a periphery of a first conductor 162, which constitutes the first electrode 160, and an upper-surface peripheral edge part of the first conductor 162. In other words, an opening is provided in the first insulating layer 150a in such a manner that a central region of the first conductor 162 is exposed.

The second insulating layer 152 is stacked on top of the first insulating layer 150a so that the top surface of the first insulating layer 150a in a peripheral edge of the opening can be exposed. In the present embodiment, the second insulating layer 152 is provided, in the form resembling a protective levee, along not only the periphery of the first electrode portion 160 but also a peripheral edge of the insulating resin layer 130. In other words, an area surrounded by the second insulating layers 152 is a recess (cavity), and the first semiconductor device 120 discussed later is mounted in this cavity.

The first insulating layer 150 and the second insulating layer 152 are formed of photo solder resists, for instance. The thickness of the first insulating layer 150a is about 20 μm to about 30 μm, for instance. The thickness of the second insulating layer 152 is about 50 μm, for instance.

As shown in FIG. 2, the first electrode portion 160 includes a first conductor 162, a second conductor 164, and a gold plating layer 166.

The first conductor 162 belongs to the same layer to which the wiring layer 140 belongs, and the first conductor 162 is formed on one main surface of the insulating resin layer 130. The thickness of the first conductor 162 is the same as that of the wiring layer 140 (e.g., about 20 μm). The diameter of the first conductor 162 is about 350 μm, for instance.

The second conductor 164 is provided on a top surface of the first conductor 162, and a top portion of the first electrode 160 protrudes above a top surface of the first insulating layer 150a. The thickness of the second conductor 164 is about 80 μm, for instance. Further, the gold plating layer 166 such as a Ni/Au layer is formed in the surface of the second conductor 164. Provision of the gold plating layer 166 suppresses the oxidation of the second conductor 164. If the Ni/Au layer is to be formed as the gold plating layer 166, the thickness of Ni layer will be about 1 μm to about 15 μm, for instance, and the thickness of Au layer will be about 0.03 μm to about 1 μm, for instance. The second insulating layer 152 is located slightly apart from a top portion of the first electrode 160 and is provided, on top of the first insulating layer 150a, in the periphery of the top portion of the first electrode portion 150. In other words, in an opening of the second insulating layer 152, a gap or space is provided between the top portion of the first electrode portion 160 and the side wall of the second insulating layer 152. In the present embodiment, the first electrode portion 160 is curved in shape; more specifically, the first electrode portion 160 is formed such that the shape of the top portion of the first electrode portion 160 is semi-spherical. Also, in the present embodiment, the uppermost part of the top portion of the first electrode portion 160 is positioned lower than the top surface of the second insulating layer 152.

Referring now back to FIG. 1, a third insulating layer 154 is provided on the other of the main surfaces of the insulating resin layer 130. The third insulating layer 154 has openings in which solder balls 80 are placed on the third electrode portions 142. The solder ball 80 is connected to the third electrode portion 142 within the opening provided in the third insulating layer 154.

The first semiconductor device 120 is mounted on top of the first insulating layer 150b formed in the above-described first device mounting board 110. A device electrode (not shown) provided on the first semiconductor device 120 and the gold plating layer 141 formed on the wiring layer 140 in a predetermined region of the insulating resin layer 130 are wire-bonded to each other using a gold wire 121. An example of the first semiconductor device 120 is a semiconductor chip such as an integrated circuit (IC) or a large-scale integrated circuit (LSI).

A sealing resin layer 180 seals the first semiconductor device 120, and the wiring layer 140 and the gold plating layer 141 connecting to the first semiconductor device 120. The sealing resin layer 180 is formed of an epoxy resin, for instance, by using a transfer mold method.

The second semiconductor module 200 is structured such that a second semiconductor device (chip) 220 is mounted on a second device mounting board 210.

The second device mounting board 210 includes an insulating resin layer 230 as a base material, a wiring layer 240 formed on one of main surfaces of the insulating resin layer 230, a second electrode portion 242 formed on the other of main surfaces of the insulating resin layer 230, a fourth insulating layer 250 formed on one main surface of the insulating resin layer 230, and a fifth insulating layer 252 formed on the other main surface of the insulating resin layer 230.

The insulating resin layer 230 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like.

The wiring layer 240 of a predetermined pattern is provided on one main surface ("semiconductor device mounting surface") of the insulating resin layer 230. A gold plating layer 246 is formed on top of the wiring layer 240. The second electrode portion 242 is provided on the other main surface of the insulating resin layer 230. A material that forms the wiring layer 240 and the second electrode portion 242 may be copper, for instance. The wiring layer 240 and the second electrode 242 are electrically coupled to each other by a via conductor (not shown) that penetrate the insulating resin layer 230 in a predetermined position. Though not shown in FIG. 1 and FIG. 2, there is provided another wiring layer which belongs to the same layer to which the second electrode portion 242 belongs, and this another wiring layer has the same height as that of the second electrode portion 242.

The fourth insulating layer 250 formed of a photo solder resist or the like is provided on one main surface of the insulating resin layer 230. Also, the fifth insulating layer 252 formed of a photo solder resist or the like is provided on the other main surface of the insulating resin layer 230. The fifth insulating layer 252 has openings in which solder balls 270 are placed on the second electrode portions 242. The solder ball 270 is connected to the second electrode portion 242 within the opening provided in the fifth insulating layer 252.

The second semiconductor device 220 is mounted on the above-described second device mounting board 210. More specifically, the second semiconductor device 220 is mounted on top of a semiconductor device forming region of the fourth insulating layer 250. A device electrode (not shown) provided on the second semiconductor device 220 and the gold plating layer 246 formed on the wiring layer 240 in a predetermined region of the insulating resin layer 230 are wire-bonded to each other using a gold wire 221. An example of the second semiconductor device 220 is a semiconductor chip such as an integrated circuit (IC) or a large-scale integrated circuit (LSI).

A sealing resin layer 280 seals the second semiconductor device 220 and the wiring layer 240 connecting to the second semiconductor device 220. The sealing resin layer 280 is formed of an epoxy resin, for instance, by using the transfer mold method.

A PoP structure, where the second semiconductor module 200 is mounted above the first semiconductor module (above the sealing resin layer 180) is achieved in such a manner that the first electrode portions 160 of the first semiconductor module 100 and the second electrode portions 242 of the second semiconductor module 200 are joined to the solder balls 270. The solder ball 270 is filled into the opening provided in the second insulating layer 152; in the opening provided in the second insulating layer 152, and a gap or space between the top portion of the first electrode portion 160 and the side wall of the second insulating layer 152 is filled with a solder material that constitutes the solder ball 270.

By employing the semiconductor device 10 according to the first embodiment, at least the following advantageous effects (1) to (4) are achieved.

(1) The top portion of the first electrode portion 160 does not have sharp corners where the stress otherwise tends to be concentrated. Thus, the stress is less likely to be concentrated on the top portion of the first electrode portion 160. As a result, the connection reliability between the first electrode portion 160 and the solder ball 270 improves when the solder ball is jointed to the first electrode portion 160. Hence, cracks are less likely to occur between the first electrode 160 and the solder ball 270.

(2) The solder material enters a space between the first electrode portion 160 and the side wall of the opening in the second insulating layer 152. This further increases the contact area between the solder ball 270 and the first electrode portion 160. As a result, the connection reliability between the first electrode portions 160 and the solder balls 270 can be further enhanced.

(3) A bonded interface between the first electrode portion 160 and the solder ball 270 lies within the second insulating layer 152. Thus, the second insulating layer 152 functions as a stress relaxation layer when a stress occurs at the bonded interface between the first electrode portion 160 and the solder ball 270. As a result, the connection reliability between the first electrode portions 160 and the solder balls 270 can be enhanced.

(4) Since the uppermost part of the top portion of the first electrode portion 160 is positioned lower than the top surface of the second insulating layer 152, the solder ball is easily fit to the opening in the second insulating layer 152. As a result, the positioning of solder balls can be made easily.

(Method for Fabricating a Semiconductor Device)

A method for manufacturing a semiconductor device 10, which includes a device mounting board 110 and a first semiconductor module 100, according to the first embodiment is described hereinbelow with reference to FIG. 3A to FIG. 5C. FIGS. 3A to 3D, FIGS. 4A to 4D and FIGS. 5A to 5C are cross-sectional views showing a sequence of processes in a method for fabricating the semiconductor device according to the first embodiment.

Figure 3A:
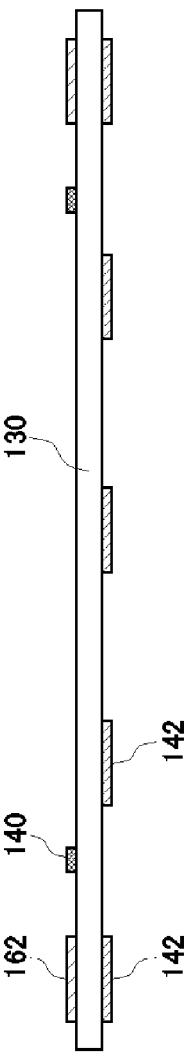
FIGS. 3A to 3D are cross-sectional views showing a process in a method for fabricating a semiconductor device according to a first embodiment.

As illustrated in FIG. 3A, an insulating resin layer 130 is first prepared. The insulating resin layer 130 is such that a wiring layer 140 of a predetermined pattern and a first conductor 162 of a first electrode portion 160 connected to this wiring layer 140 are formed on one main surface of the insulating resin layer 130 and such that a lower-surface-side wiring layer (not shown) of a predetermined pattern and a third electrode portion 142 connected to this wiring layer are formed on the other main surface thereof. Each wiring layer and each electrode portion may be formed using known photolithography method and etching method and therefore the description thereof is omitted here.

Figure 3B:
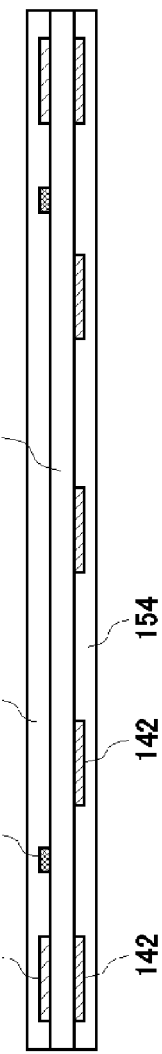

Then, as illustrated in FIG. 3B, a first insulating layer 150 is stacked on one main surface of the insulating resin layer 130 in such a manner as to cover the wiring layer 140 and the first conductor 162. Also, a third insulating layer 154 is stacked on the other main surface of the insulating resin layer 130 in such a manner as to over the lower-surface-side wiring layer and the third electrode portion 142.

Figure 3C:
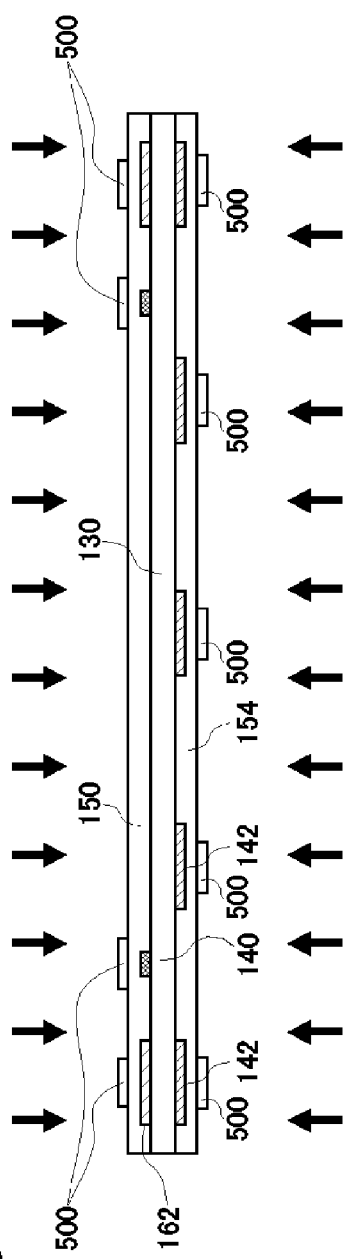
Figure 3D:
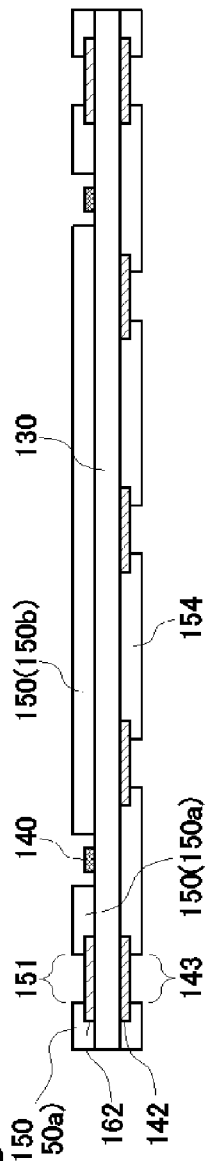

Then, as illustrated in FIG. 3C, a glass mask 500 having aperture patterns that correspond to both a predetermined region of the wiring layer 140 and a conductor existent region of the conductor 162 is placed on one main surface of the first insulating layer 150; while a glass mask 500 having aperture patterns that correspond to both the lower-surface-side wiring layer and the third electrode portion 142 is placed on one main surface of the third insulating layer 154, the first insulating layer 150 and the third insulating layer 154 are subjected to exposure. Note that the first insulating layer 150 and the third insulating layer 154 are exposed simultaneously. The arrows shown in FIG. 3C indicate the light for exposure. The first insulating layer 150 is formed of a negative working photo solder resist. Accordingly, the exposed portions thereof become insoluble to solvent. The first insulating layer 150 has been subjected to exposure and then it is developed. Thus, as illustrated in FIG. 3D, the exposed portions of the first insulating layer 150 remain intact. As a result, an opening 151 is formed in the first insulating layer 150a and therefore the first conductor 162 is exposed there. Also, the wiring layer 140 is exposed. Also, the first insulating layer 150b is formed in alignment with a device mounting region. Similarly, an opening 143 is also formed in the third insulating layer 154.

Then, as illustrated in FIG. 4A, a second insulating layer 152 is stacked on top of the first insulating layer 150 in such a manner as to cover the wiring layer 140 and the first conductor 162.

Then, as illustrated in FIG. 4B, a glass mask 510 having patterns such that an opening is provided in the periphery of each opening 151 is placed on one main surface of the second insulating layer 152, and the second insulating layer 152 is subjected to exposure. The arrows shown in FIG. 4B indicate the light for exposure. The arrows shown in FIG. 4B indicate the light for exposure. The second insulating layer 152 is formed of a negative working photo solder resist. Accordingly, the exposed portions of the second insulating layer 152 become insoluble to solvent. The second insulating layer 152 has been subjected to exposure and then it is developed. Thus, as illustrated in FIG. 4C, the exposed portions of the second insulating layer 152 remain intact. The second insulating layer 152 is selectively formed on top of the first insulating layer 150a, and the second insulating layer 152 has an opening 153 whose diameter is larger than that of the opening 151. The first conductor 162 is exposed through the opening 151 and the opening 153. Also, the first insulating resin layer 150b, positioned in a predetermined mounting region of the first semiconductor device 120, and the wiring layer 140 are exposed.

Then, as illustrated in FIG. 4D, a resist 520 is selectively formed on the one main surface side of the insulating resin layer 130 using the photolithography method in such a manner that the first conductor 162 is exposed, namely, not covered by the resist 520, and the wiring layer 140 is covered by the resist 520. Also, a resist 530 is selectively formed on the other main surface side of the insulating resin layer 130 in such a manner that the third electrode portion 142 is covered thereby. In this state, as illustrated in FIG. 4D, copper is deposited on top of the first conductor 162, by an electrolytic plating, in the opening 151 provided in the first insulating layer 150a. In a plating process, copper is first gradually filled into the opening 151, provided in the first insulating layer 150a, starting from the surface of the first conductor 162, and then the opening 151 is completely filled with copper. Furthermore, a plating buildup continues, so that copper grows upward and is eventually filled up in the opening 153 of the second insulating layer 152 in a swollen-out shape. Thereby, a second conductor 164 is formed on top of the first conductor 162. Here, the plating buildup or plating buildup process is a process where the film thickness becomes greater gradually by the plating; the plating buildup may be roughly thought of as a buildup processing that uses a coating (plating). The top surface of the second conductor 164, which is positioned higher than the top surface of the first insulating layer 150a, is semi-spherical in shape (having a curved surface). Also, the uppermost part of the top portion of the second conductor 164 is positioned lower than the top surface of the second insulating layer 152. Also, a gap or space is formed between the top portion of the second conductor 164 and the side wall of the second insulating layer 152 in the opening 153. Formation of such a shape and profile as described above can be achieved by employing a method where the time duration of a plating buildup process is adjusted in accordance with a design condition such as the size of the opening 153.

As illustrated in FIG. 5A, after the removal of the resist 520 and the resist 530, a gold plating layer 141, a gold plating layer 166 and a gold plating layer 144 are formed in the surface of the wiring layer 140, the surface of the second conductor 164 and the surface of the third electrode portion 142, respectively, using the electrolytic plating, for instance. Through the above-described processes, the first electrode portion 160 comprised of the first conductor 162, the second conductor 164 and the gold plating layer 166 is formed and, at the same time, the first device mounting board 110 according to the first embodiment is formed.

Then, as illustrated in FIG. 5B, the first semiconductor device 120 is mounted on top of the first insulating layer 150b provided on a central region of the insulating resin layer 130. Then, a device electrode (not shown) provided in the upper-surface peripheral edge part of the first semiconductor device 120 is connected to the gold plating layer 141 in a predetermined region of the wiring layer 140 by a gold wire 121 using a wire bonding method. Subsequently, the first semiconductor device 120 is sealed by a sealing resin layer 180, using the transfer mold method. Also, a mask having openings in the positions where the solder balls 270 are provided is provided on top of the second insulating layer 152 having the openings 153. The spherical solder balls 270 are placed in the openings of the mask, and the solder balls 270 are mounted on the first electrode portions 160. Then the mask is removed. Similarly, solder balls 80 are mounted on the third electrode portions 142 in the openings 143 of the third insulating layer 154. The solder balls 270 are mounted on the first electrode portions 160 within the openings 153 of the second insulating layer 152 by using a screen printing method, for instance. More specifically, the solder balls 270 are formed by printing a solder paste, which is a pasty mixture of resin and solder material, in desired positions through a screen mask. Similarly, the solder balls 80 are mounted on the third electrode portions 160 within the openings 143 of the third insulating layer 154. Through the processes as described above, a first semiconductor module 100 according to the present embodiment is manufactured.

Then, as illustrated in FIG. 5C, the semiconductor module 200 structured as shown in FIG. 1 is prepared. Then, a reflow process is performed with the second semiconductor module 200 mounted on top of the first semiconductor module 100. That is, in this reflow process, the solder balls 270 are melted, thereby joining the first electrode portions 160 to the second electrode portions 242. As a result, the first semiconductor module 100 and the second semiconductor module 200 are electrically connected to each other through the medium of the solder balls 270. Thus, a semiconductor device 10 according to the first embodiment is manufactured through the above-described processes.

Second Embodiment

Figure 6:
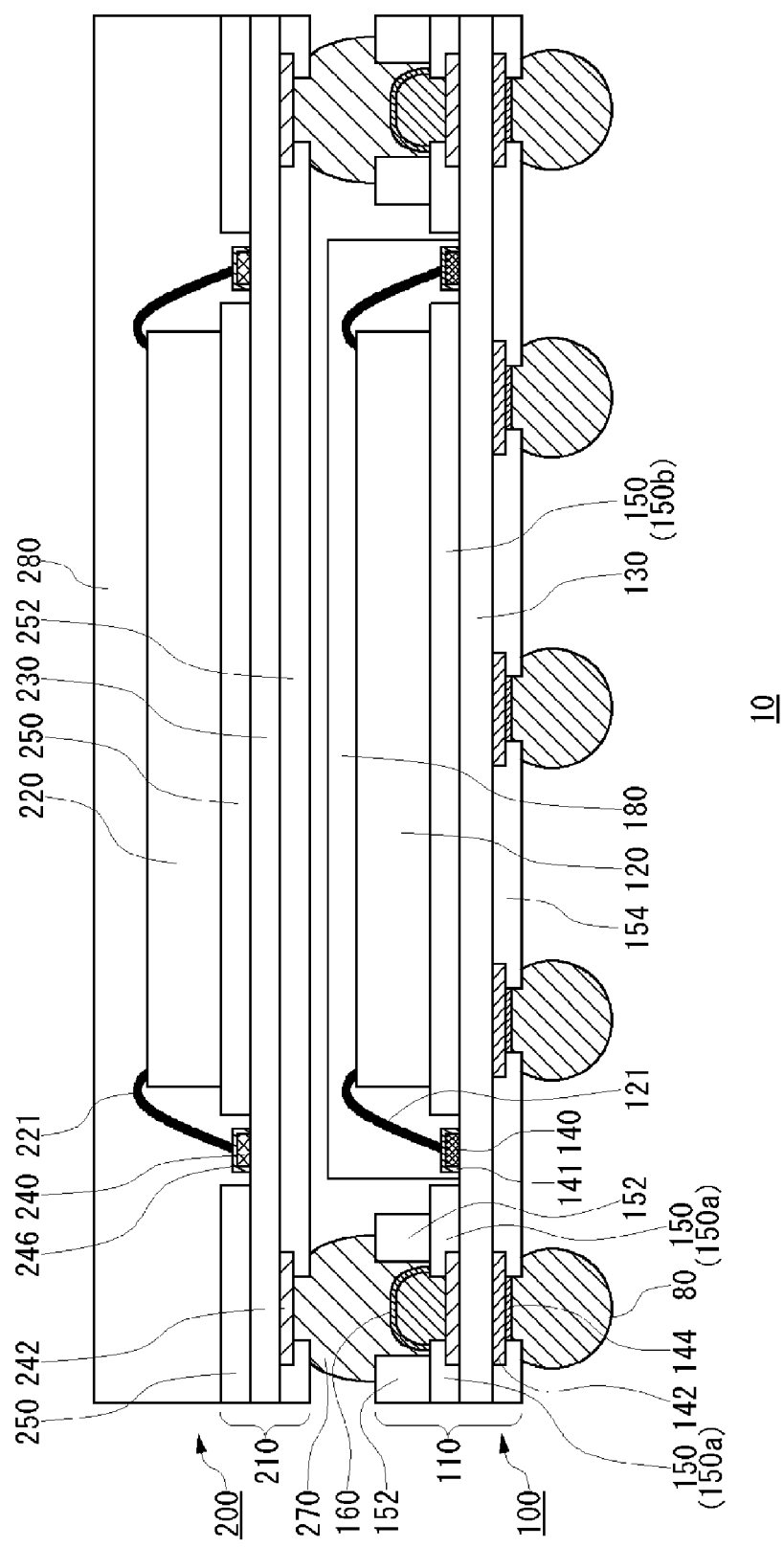
FIG. 6 is a schematic cross-sectional view showing a structure of a semiconductor device according to a second embodiment of the present invention.

FIG. 6 is a schematic cross-sectional view showing a structure of a semiconductor device according to a second embodiment of the present invention. The basic structure of the semiconductor device according to the second embodiment is similar to that of the first embodiment, except for the structure of the first electrode portion 160. Thus, as for the semiconductor device according to the second embodiment, the repeated description of the same structural components thereof as those of the first embodiment is omitted as appropriate and a description is hereinbelow given centering around the difference therefrom.

In the semiconductor device 10 according to the second embodiment, the first electrode portion 160 is shaped such that the top portion of the first electrode portion 160 is formed by a curved surface and a plane surface smoothly connected to the curved surface. More specifically, the shape of the top portion of the first electrode portion 160 is domy with an uppermost part of the top portion thereof being flat. Formation of such a shape and profile of the top portion of the first electrode portion 160 can be achieved by employing a method where the current density is adjusted. The current density is one factor among the plating processing conditions in a plating buildup process as shown in FIG. 4D.

By employing the semiconductor device 10 according to the second embodiment, the same advantageous effects (1) to (4) as those described regarding the semiconductor device 10 according to the first embodiment are achieved.

Third Embodiment

Figure 7:
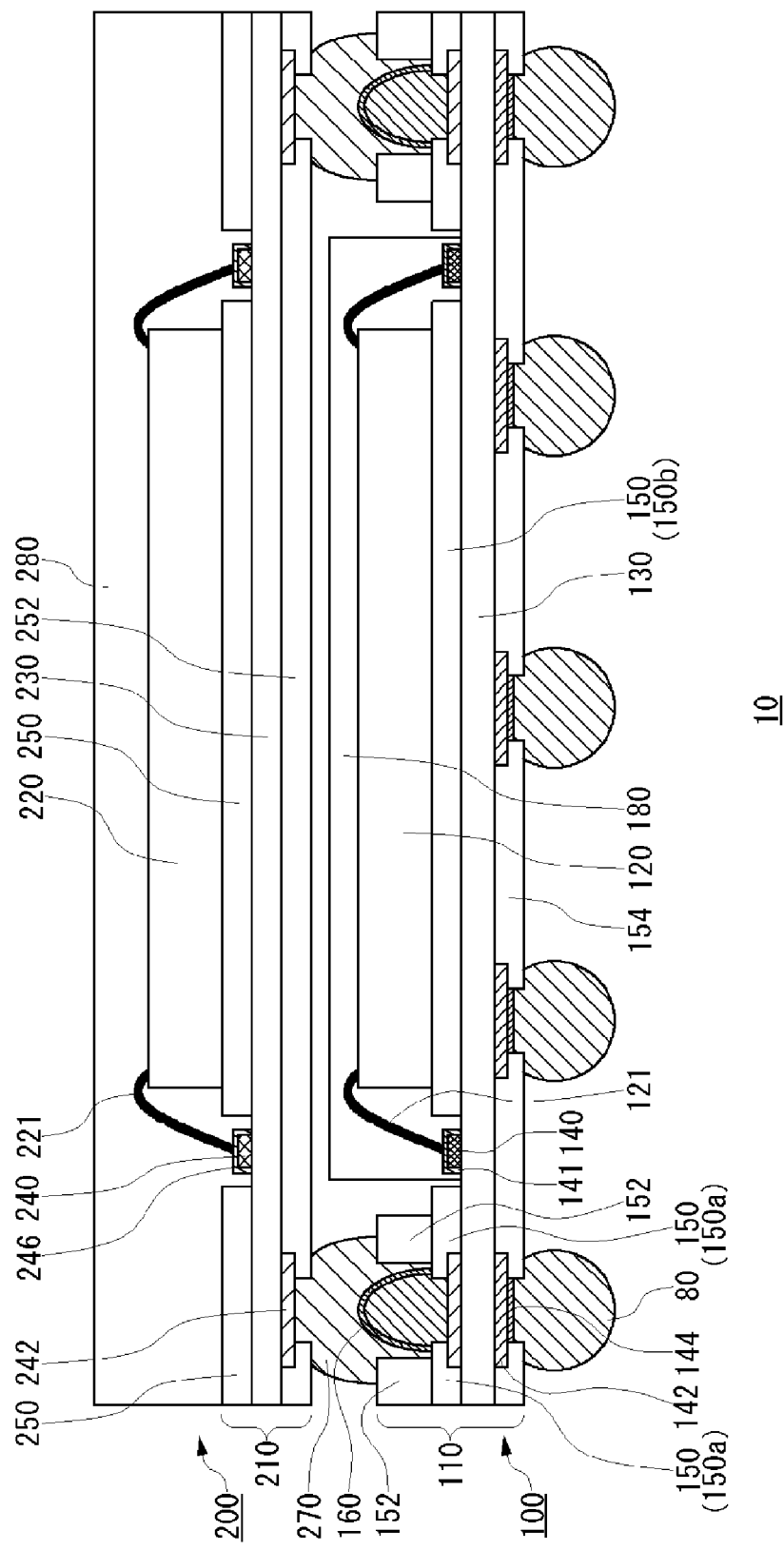
FIG. 7 is a schematic cross-sectional view showing a structure of a semiconductor device according to a third embodiment of the present invention.

FIG. 7 is a schematic cross-sectional view showing a structure of a semiconductor device according to a third embodiment of the present invention. The basic structure of the semiconductor device according to the third embodiment is similar to that of the first embodiment, except for the structure of the first electrode portion 160. Thus, as for the semiconductor device according to the third embodiment, the repeated description of the same structural components thereof as those of the first embodiment is omitted as appropriate and a description is hereinbelow given centering around the difference therefrom.

In the third embodiment, the uppermost part of the top portion of the first electrode portion 160 is positioned higher than the top surface of the second insulating layer 152.

By employing the semiconductor device 10 according to the third embodiment, at least the following advantageous effect (5) is achieved in addition to the above-described effects.

(5) The contact area between the first electrode portion 160 and the solder ball 270 increases, so that the connection reliability between the first electrode portions 160 and the solder balls 270 improves.

Fourth Embodiment

Figure 8:
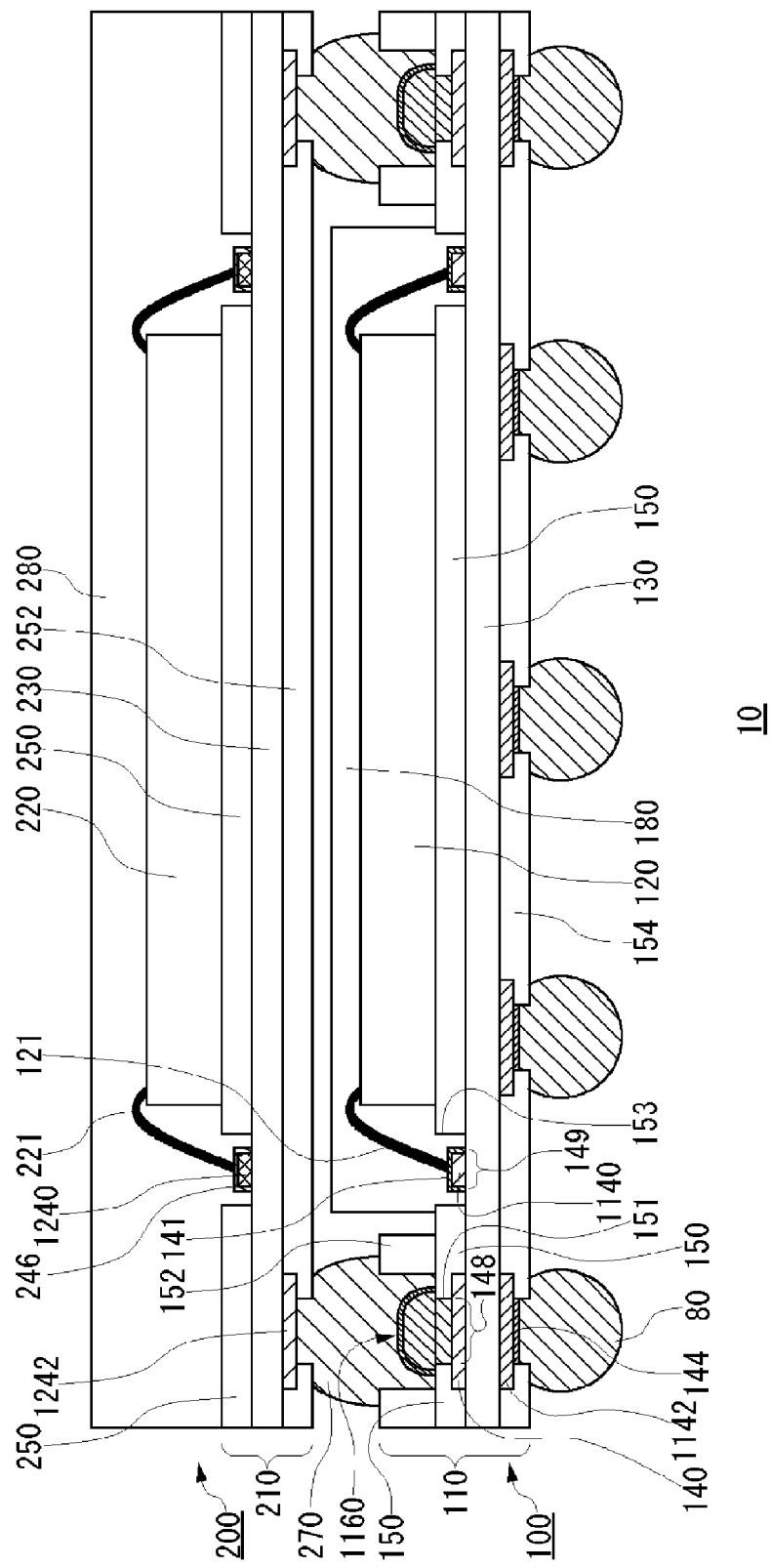
FIG. 8 is a schematic cross-sectional view showing a structure of a semiconductor device according to a fourth embodiment of the present invention.
Figure 9:
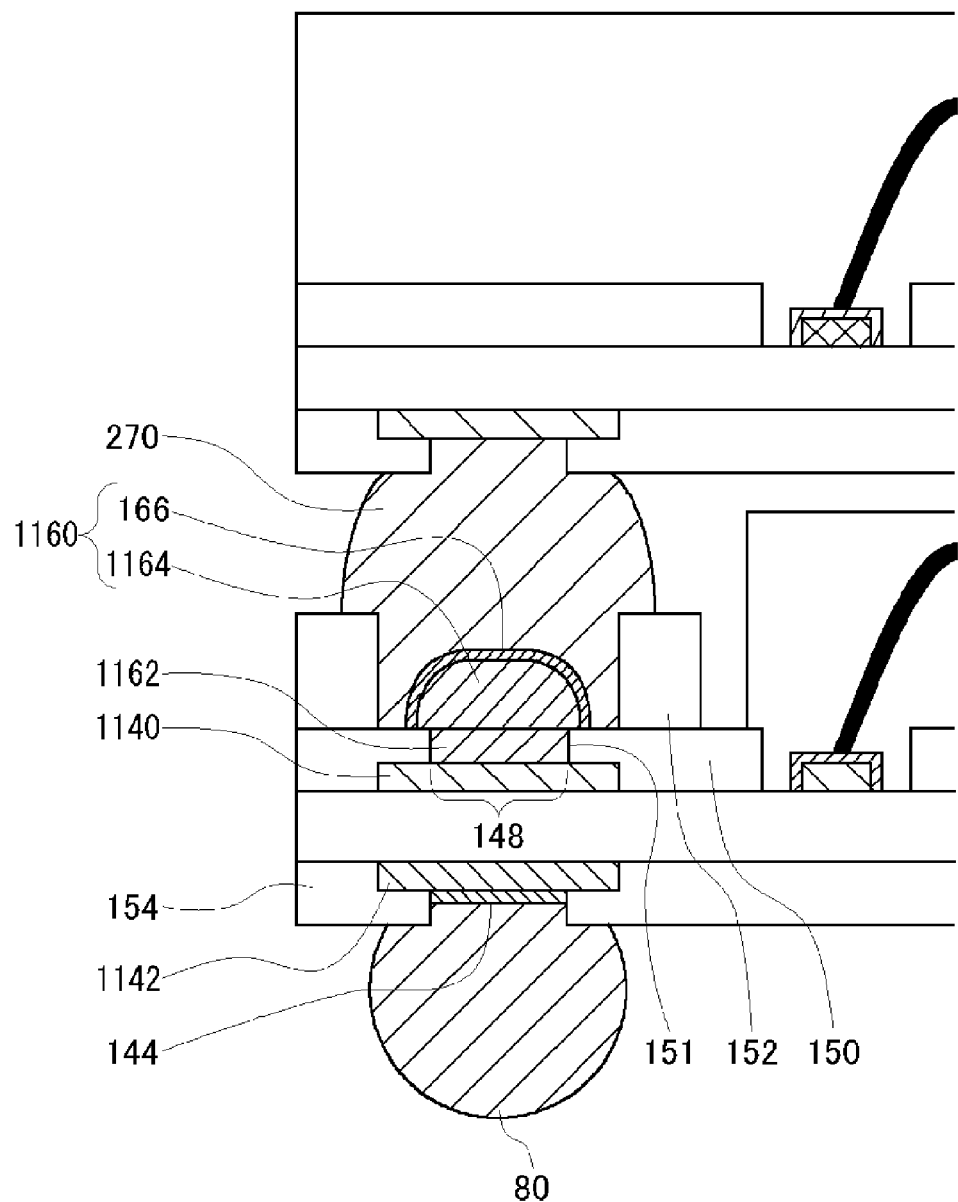
FIG. 9 is a partial enlarged view showing a structure of an electrode portion in a semiconductor device according to a fourth embodiment and the periphery of the electrode portion.

FIG. 8 is a schematic cross-sectional view showing a structure of a semiconductor device 10 according to a fourth embodiment of the present invention. FIG. 9 is a partial enlarged view showing a structure of an electrode portion 1160 in the semiconductor device 10 and the periphery of the electrode portion 1160. The semiconductor device 10 has a package-on-package (PoP) structure where a second semiconductor module 200 is stacked on top of a first semiconductor module 100.

The first semiconductor module 100 is structured such that a first semiconductor device (chip) 120 is mounted on a first device mounting board 110.

The first device mounting board 110 includes an insulating resin layer 130 as a base material, a wiring layer 1140 formed on one of main surfaces of the insulating resin layer 130, an electrode portion 1160, a first insulating layer 150, a second insulating layer 152, a second wiring layer 1142, and a third insulating layer 154, both the second insulating layer 1142 and the third insulating layer 154 being formed on the other main surface of the insulating resin layer 130.

The insulating resin layer 130 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like.

The wiring layer 1140 of a predetermined pattern is provided on one main surface of the insulating resin layer 130. In the present embodiment, the one main surface of the insulating resin layer 130 is the surface thereof on which the first semiconductor device 120 is placed, and will be referred to as "semiconductor device mounting surface" also. The first wiring layer 1140 has a leading region 148 for use with external connection terminals and an electrode region 149 for use with connection terminals of electronic components mounted on the device mounting board 110. The leading region 148 is mainly placed in an end of wire connection in the first wiring layer 1140. The electrode portion 1160 is provided, above the leading region 148 of the first wiring layer 1140, as an external connection terminal. The detail of the first electrode portion 1160 will be described later.

Via conductors (not-shown), which penetrate the insulating resin layer 130, are provided in predetermined positions of the insulating resin layer 130. The via conductor is formed by a plating method using copper, for instance. A predetermined portion of the first wiring layer 1140 is connected to the second wiring layer 1142 by the via conductor.

The first insulating layer 150 is provided on one main surface of the insulating resin layer 130. The first insulating layer 150 is so provided as to cover the first wiring layer 1140 and has an opening 151 where the leading region 148 of the first wiring layer 1140 is exposed. Also, the first insulating layer 150 has an opening 153 where the electrode region 149 of the first wiring layer 1140 is exposed. A gold plating layer 141 such as a Ni/Au layer is formed on top of the electrode region 149 of the first wiring layer 1140. Provision of the gold plating layer 141 covering the electrode region 149 of the first wiring layer 1140 suppresses the oxidation of the electrode region 149. If the Ni/Au layer is to be formed as the gold plating layer 141, the thickness of Ni layer will be about 1 μm to about 15 μm, for instance, and the thickness of Au layer will be about 0.03 μm to about 1 μm, for instance.

The second insulating layer 152 is stacked on top of the first insulating layer 150 so that the top surface of the first insulating layer 150 in a peripheral edge of the opening 151 provided in the first insulating layer 150 can be exposed. In the present embodiment, the second insulating layer 152 is provided, in the form resembling a protective levee, along not only the periphery of the electrode portion 1160 but also a peripheral edge of the insulating resin layer 130. In other words, an area surrounded by the second insulating layers 152 is a recess (cavity), and the first semiconductor device 120 discussed later is mounted in this cavity.

The first insulating layer 150 and the second insulating layer 152 are formed of photo solder resists, for instance. The thickness of the first insulating layer 150 is about 20 μm to about 30 μm, for instance. The thickness of the second insulating layer 152 is about 50 μm to about 100 μm, for instance.

As shown in FIG. 9, the leading portion 1162 is provided in the opening 151, which is provided in the first insulating layer 150, and the leading portion 1162 is electrically connected to the leading region 148 of the first wiring layer 1140.

The electrode portion 1160 is provided above the leading region 148 and protrudes above a top surface of the first insulating layer 150. The electrode portion 1160 includes a conductor 1164 and a gold plating layer 166.

The conductor 1164 is electrically connected to the leading portion 1162. The diameter of the conductor 1164 is greater than that of the opening 151 of the first insulating layer 150, namely the diameter of the leading portion 1162, and a circumferential lower part of the conductor 1164 is in contact with the top surface of the first insulating layer 151. The diameter of the leading portion 1162 and the diameter of the conductor 1164 are about 200 μm and about 250 μm, respectively, for instance. The thickness of the conductor 1164 is about 80 μm, for instance. Further, the gold plating layer 166 such as a Ni/Au layer is formed in the surface of the conductor 1164. Provision of the gold plating layer 166 suppresses the oxidation of the conductor 1164. If the Ni/Au layer is to be formed as the gold plating layer 166, the thickness of Ni layer will be about 1 μm to about 15 μm, for instance, and the thickness of Au layer will be about 0.03 μm to about 1 μm, for instance. The second insulating layer 152 is located slightly apart from the electrode portion 1160 and is provided, on top of the first insulating layer 150, in the periphery of the electrode portion 1160. In other words, in the opening of the second insulating layer 152, a gap or space is provided between the electrode portion 1160 and the side wall of the second insulating layer 152. In this manner, the electrode portion 1160 is of an NSMD type electrode structure. In the fourth embodiment, the uppermost part of the electrode portion 1160 is positioned lower than the top surface of the second insulating layer 152.

A material that forms the first wiring layer 1140, the leading portion 1162 and the conductor 1164 may be copper, for instance. The leading portion 1162 and the conductor 1164 may be formed integrally with each other. In such a case, the connection reliability between the leading portion 1162 and the conductor 1164 can be enhanced.

Referring back to FIG. 8, the second wiring layer 1142 of a predetermined pattern is provided on the other main surface of the insulating resin layer 130. A gold plating layer 144 is provided in the surface of en electrode region of the second wiring layer 1142. A material that forms the first wiring layer 1140 and the second wiring layer 1142 may be copper, for instance. The thickness of the first wiring layer 1140 and the thickness of the second wiring layer 1142 may each be 20 µm, for instance.

Also, the insulating layer 154 is provided on the other main surface of the insulating resin layer 130. The third insulating layer 154 has openings in which solder balls 80 are placed on the second wiring layer 1142. The solder ball 80 is connected to the third electrode portion 1142 within the opening provided in the third insulating layer 154.

The first semiconductor device 120 is mounted on top of the semiconductor device mounting region of the first insulating layer 150 formed in the above-described first device mounting board 110. A device electrode (not shown) provided on the first semiconductor device 120 and the gold plating layer 141 formed on the electrode region 149 of the first wiring layer 1140 are wire-bonded to each other using a gold wire 121. An example of the first semiconductor device 120 is a semiconductor chip such as an integrated circuit (IC) or a large-scale integrated circuit (LSI).

A sealing resin layer 180 seals the first semiconductor device 120 and the gold plating layer 141 connecting to the first semiconductor device 120. The sealing resin layer 180 is formed of an epoxy resin, for instance, by using the transfer mold method.

The second semiconductor module 200 is structured such that a second semiconductor device (chip) 220 is mounted on a second device mounting board 210.

The second device mounting board 210 includes an insulating resin layer 230 as a base material, a third wiring layer 1240 formed on one of main surfaces of the insulating resin layer 230, a fourth wiring layer 1242 formed on the other main surface of the insulating resin layer 230, a fourth insulating layer 250 formed on one main surface of the insulating resin layer 230, and a fifth insulating layer 252 formed on the other main surface of the insulating resin layer 230.

The insulating resin layer 230 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like.

The third wiring layer 1240 of a predetermined pattern is provided on one main surface ("semiconductor device mounting surface") of the insulating resin layer 230. A gold plating layer 246 is formed on top of the third wiring layer 1240. The fourth wiring layer 1242 is provided on the other main surface of the insulating resin layer 230. A material that forms the third wiring layer 1240 and the fourth wiring layer 1242 may be copper, for instance. The third wiring layer 1240 and the fourth wiring layer 1242 are electrically coupled to each other by a via conductor (not shown) that penetrate the insulating resin layer 230 in a predetermined position.

The fourth insulating layer 250 formed of a photo solder resist or the like is provided on one main surface of the insulating resin layer 230. Also, the fifth insulating layer 252 formed of a photo solder resist or the like is provided on the other main surface of the insulating resin layer 230. The fifth insulating layer 252 has openings in which solder balls 270 are placed on the fourth electrode portions 1242. The solder ball 270 is connected to the fourth wiring layer 1242 within the opening provided in the fifth insulating layer 252.

The second semiconductor device 220 is mounted on the above-described second device mounting board 210. More specifically, the second semiconductor device 220 is mounted on top of a semiconductor device forming region of the fourth insulating layer 250. A device electrode (not shown) provided on the second semiconductor device 220 and the gold plating layer 246 formed on an electrode region of the third wiring layer 1240 are wire-bonded to each other using a gold wire 221. An example of the second semiconductor device 220 is a semiconductor chip such as an integrated circuit (IC) or a large-scale integrated circuit (LSI).

A sealing resin layer 280 seals the second semiconductor device 220 and the third wiring layer 1240 connecting to the second semiconductor device 220. The sealing resin layer 280 is formed of an epoxy resin, for instance, by using the transfer mold method.

A PoP structure, where the second semiconductor module 200 is mounted above the first semiconductor module (above the sealing resin layer 180) is achieved in such a manner that the electrode portions 1160 of the first semiconductor module 100 and the fourth wiring layer 1242 of the second semiconductor module 200 are joined to the solder balls 270. The solder ball 270 is filled into the opening provided in the second insulating layer 152; in the opening provided in the second insulating layer 152, a gap or space between the top portion of the electrode portion 1160 and the side wall of the second insulating layer 152 is filled with a solder material that constitutes the solder ball 270.

By employing the semiconductor device 10 according to the fourth embodiment, at least the following advantageous effects (1) to (4) are achieved.

(1) The first wiring layer 1140 is electrically connected to the electrode portion 1160 at a lower part thereof via the leading portion 1162, and the leading portion is not exposed. As a result, the disconnection of the leading portions is less likely to occur and therefore the connection reliability between the electrode portions 1160 and the solder balls 270 can be improved.

(2) The solder material enters a space between the electrode portion 1160 and the side wall of the opening in the second insulating layer 152. This further increases the contact area between the solder ball 270 and the electrode portion 1160. As a result, the connection reliability between the electrode portions 1160 and the solder balls 270 can be further enhanced.

(3) A bonded interface between the electrode portion 1160 and the solder ball 270 lies within the second insulating layer 152. Thus, the second insulating layer 152 functions as a stress relaxation layer when a stress occurs at the bonded interface between the electrode portion 1160 and the solder ball 270. As a result, the connection reliability between the electrode portions 1160 and the solder balls 270 can be enhanced.

(4) Since the electrode portion 1160 is provided above the leading portion of the first wiring layer 1140, it is no longer required to provide any extra region used for the electrode portion 1160 other than that used for the first wiring layer 1140. Thus, a higher density of the wiring can be attained. Also, since the diameter of the electrode portion 1160 can be reduced, the wiring is highly dense.

Note here that a side wall of the opening 151 in the first insulating layer 150 may be of a reverse tapered shape such that an upper part of the side wall thereof is inclined inward the opening 151. This shape and profile make it difficult for the leading portion 1162 to pass through the opening 151. As a result, the connection reliability of the semiconductor device 10 can be further improved.

(Method for Fabricating a Semiconductor Device)

A method for manufacturing a semiconductor device 10, which includes a device mounting board 110 and a first semiconductor module 100, according to the fourth embodiment is described hereinbelow with reference to FIG. 10A to FIG. 12C. FIGS. 10A to 10D, FIGS. 11A to 11D and FIGS. 12A to 12C are cross-sectional views showing a process in a method for fabricating the semiconductor device 10 according to the fourth embodiment.

Figure 10A:
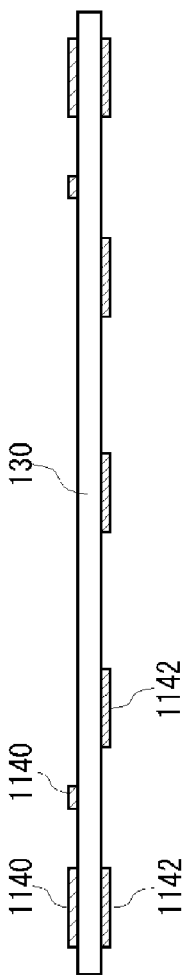
FIGS. 10A to 10D are cross-sectional views showing a process in a method for fabricating a semiconductor device according to a fourth embodiment.

As illustrated in FIG. 10A, an insulating resin layer 130 is first prepared. This insulating resin layer 130 is such that a first wiring layer 1140 of a predetermined pattern is formed on one main surface of the insulating resin layer 130 and such that a lower-surface-side wiring layer (not shown) of a predetermined pattern and a second wiring layer 1142 connected to this wiring layer are formed on the other main surface thereof. Each wiring layer may be formed using known photolithography method and etching method and therefore the description thereof is omitted here.

Figure 10B:
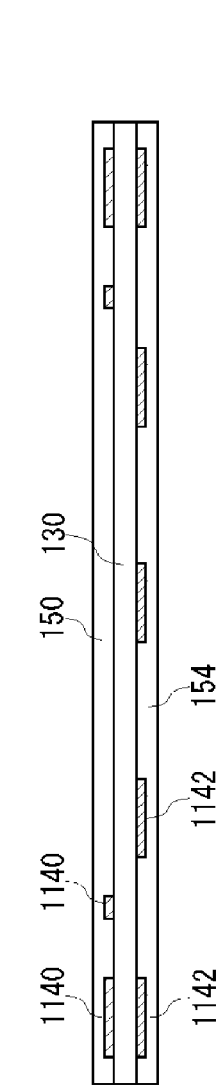

Then, as illustrated in FIG. 10B, a first insulating layer 150 is stacked on one main surface of the insulating resin layer 130 in such a manner as to cover the first wiring layer 1140. Also, a third insulating layer 154 is stacked on the other main surface of the insulating resin layer 130 in such a manner as to cover the second wiring layer 1142.

Figure 10C:
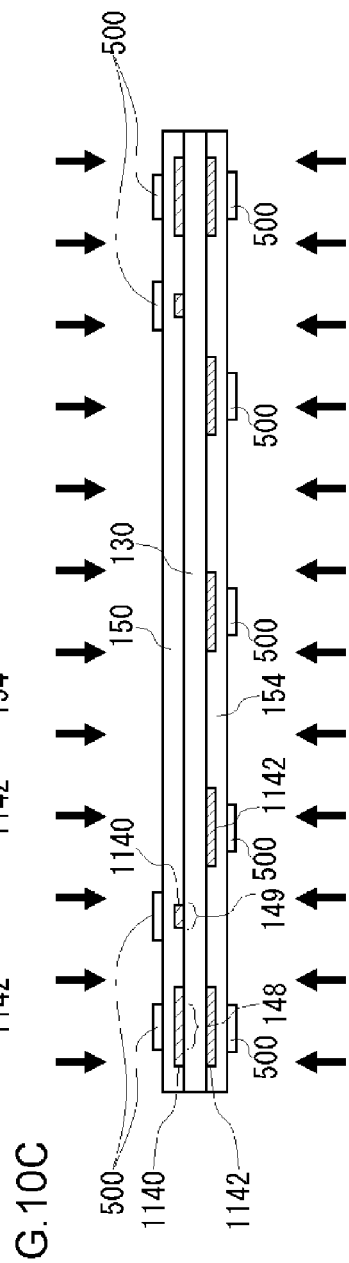
Figure 10D:
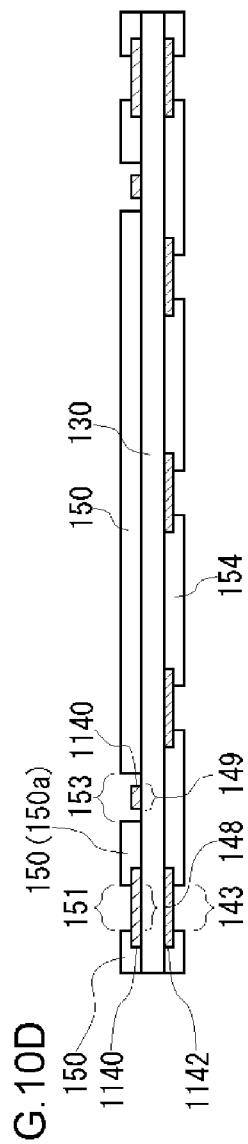

Then, as illustrated in FIG. 10C, a glass mask 500 having aperture patterns that correspond to both a leading region 148 of the wiring layer 1140 and an electrode region 149 thereof is placed on one main surface of the first insulating layer 150; while a glass mask 500 having aperture patterns that correspond to both the lower-surface-side wiring layer and the third electrode portion 1142 is placed on one main surface of the third insulating layer 154, the first insulating layer 150 and the third insulating layer 154 are subjected to exposure. Note that the first insulating layer 150 and the third insulating layer 154 are exposed simultaneously. The arrows shown in FIG. 10C indicate the light for exposure. The first insulating layer 150 is formed of a negative working photo solder resist. Accordingly, the exposed portions of the first insulating layer 150 become insoluble to solvent. The first insulating layer 150 has been subjected to exposure and then it is developed. Thus, as illustrated in FIG. 10D, the exposed portions of the first insulating layer 150 remain intact. As a result, an opening 151 is formed in the first insulating layer 150 and therefore the leading region 148 of the first wiring layer 1140 is exposed there. Also, an opening 153 is formed in the first insulating layer 150 and therefore the electrode region 149 of the first wiring layer 1140 is exposed there. Similarly, an opening 143 is formed in the third insulating layer 154. The diameter of the opening 151 is the same as that of the leading region 148, whereas the diameter of the opening 153 is greater than that of the electrode region 149 and part of the insulating resin layer 130 is exposed in a periphery of the electrode region 149.

Then, as illustrated in FIG. 11A, a second insulating layer 152 is stacked on top of the first insulating layer 150 in such a manner as to cover the leading region 148 of the first wiring layer 1140 and the electrode region 149 thereof.

Then, as illustrated in FIG. 11B, a mask 510 having a pattern such that an opening is provided in the periphery of the opening 151 is selectively formed on one main surface of the second insulating layer 152 using the photolithography method. Then, the second insulating layer 152 is subjected to exposure using the mask 510 as a mask. The arrows shown in FIG. 11B indicate the light for exposure. The second insulating layer 152 is formed of a negative working photo solder resist. Accordingly, the exposed portions of the second insulating layer 152 become insoluble to solvent. The second insulating layer 152 has been subjected to exposure and then it is developed. Thus, as illustrated in FIG. 11C, the exposed portions of the second insulating layer 152 remain intact. The second insulating layer 152 is selectively formed on top of the first insulating layer 150, and the second insulating layer 152 has an opening 155 whose diameter is larger than that of the opening 151. The leading region 148 of the first wiring layer 1140 is exposed through the opening 151 and the opening 155. Also, the first insulating resin layer 150, positioned in a predetermined mounting region of the first semiconductor device 120, and the electrode region 149 of the first wiring layer 1140 are exposed.

Then, as illustrated in FIG. 11D, a resist 520 is selectively formed on the one main surface side of the insulating resin layer 130 using the photolithography method in such a manner that the leading region 148 of the first wiring layer 1140 is exposed, namely, not covered by the resist 520, and the electrode region 149 of the first wiring layer 1140 is covered by the resist 520. Also, a resist 530 is selectively formed on the other main surface side of the insulating resin layer 130 in such a manner that the second wiring layer 1142 is covered thereby. In this state, as illustrated in FIG. 11D, copper is deposited on top of the leading region 148, by an electrolytic plating, in the opening 151 provided in the first insulating layer 150. In a plating process, copper is first gradually filled into the opening 151, provided in the first insulating layer 150, starting from the surface of the leading region 148 of the first wiring layer 1140, and then the opening 151 is completely filled with copper. Thereby, a leading portion 1162 is formed in the opening 151. Furthermore, the plating buildup continues, so that copper grows upward and is eventually filled up in the opening 155 of the second insulating layer 152 in a swollen-out shape. Thereby, a conductor 1164 is formed on top of the leading portion 1162. In the present embodiment, the shape of the conductor 1164 is such that the corners of the conductor 1164 are rounded and the top surface thereof is flat. However, this should not be considered as limiting and, for example, the conductor 1164 may be semi-spherical in shape (having a curved surface). Also, the uppermost part of the conductor 1164 is positioned lower than the top surface of the second insulating layer 152. Also, a gap or space is formed between the conductor 1164 and the side wall of the second insulating layer 152 in the opening 155. Formation of such a shape and profile as described above can be achieved by employing a method where the time duration of the plating buildup process is adjusted in accordance with a design condition such as the size of the opening 155.

As illustrated in FIG. 12A, after the removal of the resist 520 and the resist 530, a gold plating layer 141, a gold plating layer 166 and a gold plating layer 144 are formed in the surface of the electrode region 149 of the first wiring layer 1140, the surface of the conductor 1164 and the surface of the second wiring layer 1142, respectively, using the electrolytic plating, for instance. Through the above-described processes, the electrode portion 1160 comprised of the conductor 1164 and the gold plating layer 166 is formed and, at the same time, the first device mounting board 110 according to the fourth embodiment is formed.

Then, as illustrated in FIG. 12B, the first semiconductor device 120 is mounted on top of the first insulating layer 150 provided on a central region of the insulating resin layer 130. Then, a device electrode (not shown) provided in the upper-surface peripheral edge part of the first semiconductor device 120 is connected to the gold plating layer 141 in a predetermined region of the first wiring layer 1140 by a gold wire 121 using a wire bonding method. Subsequently, the first semiconductor device 120 is sealed by a sealing resin layer 180, using the transfer mold method. Also, a mask having openings in the positions where the solder balls 270 are provided is provided on top of the second insulating layer 152 having the openings 155. The spherical solder balls 270 are placed in the openings of the mask, and the solder balls 270 are mounted on the electrode portions 1160. Then the mask is removed. Similarly, solder balls 80 are mounted on the second wiring layer 1142 in the openings 143 of the third insulating layer 154. The solder balls 270 are mounted on the electrode portions 1160 within the openings 155 of the second insulating layer 152 by using a screen printing method, for instance. More specifically, the solder balls 270 are formed by printing a solder paste, which is a pasty mixture of resin and solder material, in desired positions through a screen mask. Similarly, the solder balls 80 are mounted on the second wiring layer 1142 within the openings 143 of the third insulating layer 154. Through the processes as described above, a first semiconductor module 100 according to the fourth embodiment is manufactured.

Then, as illustrated in FIG. 12C, the semiconductor module 200 structured as shown in FIG. 8 is prepared. Then, a reflow process is performed with the second semiconductor module 200 mounted on top of the first semiconductor module 100. That is, in this reflow process, the solder balls 270 are melted, thereby joining the electrode portions 1160 to the fourth wiring layer 1242. As a result, the first semiconductor module 100 and the second semiconductor module 200 are electrically connected to each other through the medium of the solder balls 270. Thus, a semiconductor device 10 according to the fourth embodiment is manufactured through the above-described processes.

Fifth Embodiment

Figure 13:
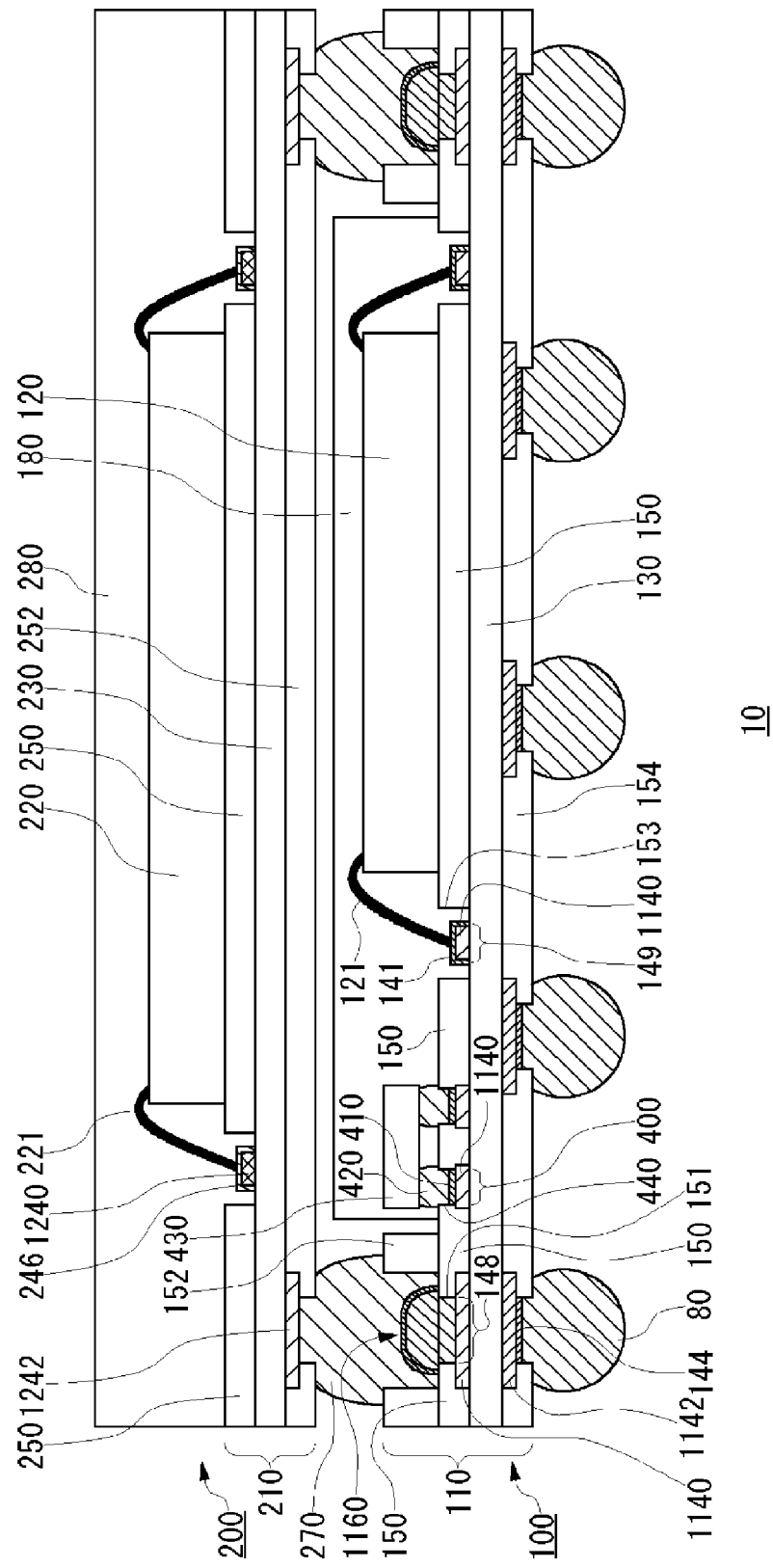
FIG. 13 is a schematic cross-sectional view showing a structure of a semiconductor device according to a fifth embodiment of the present invention.

FIG. 13 is a schematic cross-sectional view showing a structure of a semiconductor device 10 according to a fifth embodiment of the present invention. The basic structure of the semiconductor device according to the fifth embodiment is similar to that of the fourth embodiment. Thus, as for the semiconductor device according to the fourth embodiment, the repeated description of the same structural components thereof as those of the fourth embodiment is omitted as appropriate. A packaging mode where electronic components (chip components) 430 such as resistors and capacitors are mounted is exemplified in the fifth embodiment. More specifically, openings 440 are provided in a first insulating layer 150 in such a manner that the positions of the openings 440 align with electrode regions 400 of a first wiring layer 1140. A region designated for a gold plating layer 410 on the electrode region 400 of the first wiring layer 1140 is specified in the openings 440, so that the electrode region 400 and the gold layer 410 are of a solder-mask-defined (SMD) type electrode structure. An external terminal (not shown) provided in an electronic component 430 is electrically connected to the gold plating layer 410 on the electrode region 400 through the medium of a solder material 420.

By employing the semiconductor device 10 according to the fifth embodiment, at least the following advantageous effect (5) is achieved in addition to the above-described effects of the semiconductor device 10 according to the fourth embodiment.

(5) Since the electrode structure in which to mount the electronic components 430 is SMD type, the opening size of the opening 440 in the first insulating layer 150 may be set under a certain condition such that the entire opening 440 is the electrode region itself. Thus, the copper residual rate in the electrode region can be made higher. As a result, a large current can be applied to the electronic components 430. Also, a high heat radiation performance can be attained in the electrode portions for use in the electronic components 430.

Sixth Embodiment

Next, a description will be given of a mobile apparatus (portable device) provided with a semiconductor device 10 according to each of the above-described embodiments. The mobile apparatus, which incorporates the semiconductor device 10, presented as an example herein is a mobile phone, but it may be any electronic apparatus, such as a personal digital assistant (PDA), a digital video cameras (DVC) or a digital still camera (DSC).

Figure 14:
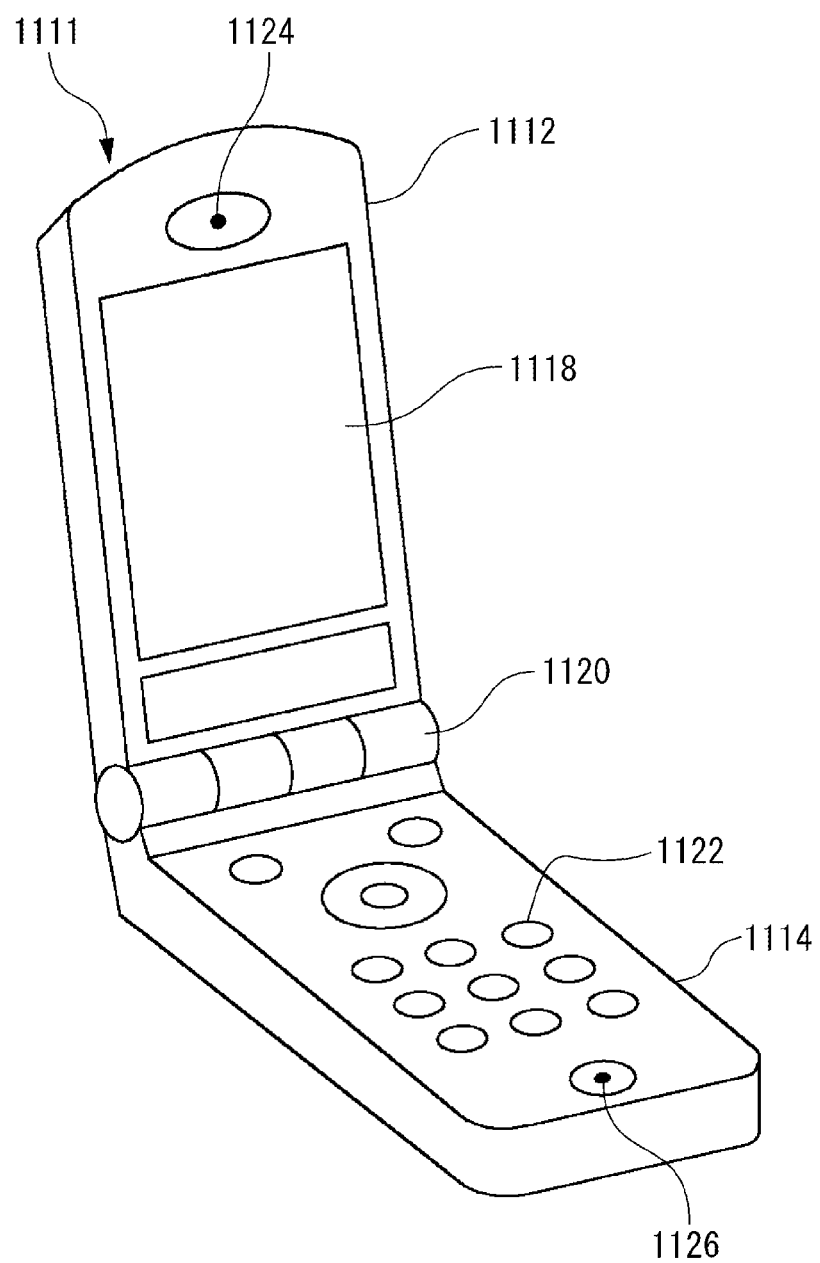
FIG. 14 illustrates a structure of a mobile phone according to a sixth embodiment.

FIG. 14 illustrates a structure of a mobile phone according to a sixth embodiment. A mobile phone 1111 has a basic structure of a first casing 1112 and a second casing 1114 jointed together by a movable part 1120. The first casing 1112 and the second casing 1114 are turnable around the movable part 1120 as the axis. The first casing 1112 is provided with a display unit 1118 for displaying characters, images and other information and a speaker unit 1124. The second casing 1114 is provided with a control module 1122 with operation buttons and a microphone 1126. Note that the semiconductor device 10 according to each of the first to fifth embodiments is mounted within a mobile phone 1111 such as this.

Figure 15:
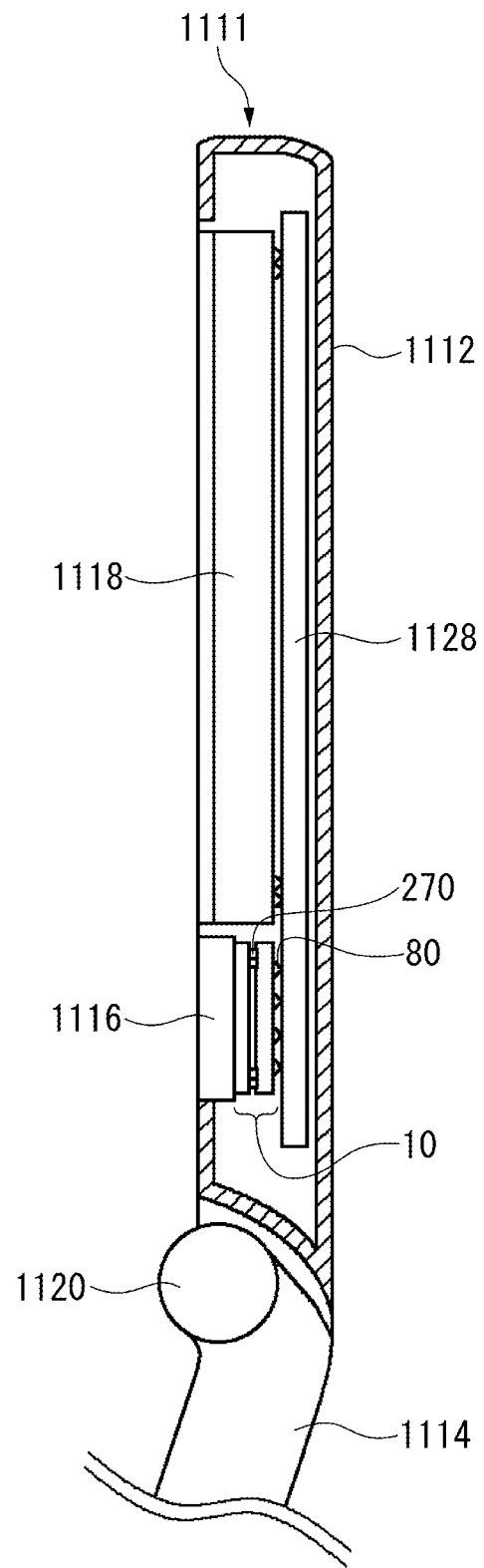
FIG. 15 is a partial cross-sectional view of a mobile phone.

FIG. 15 is a partial cross-sectional view (cross-sectional view of the first casing 1112) of the mobile phone shown in FIG. 14. The semiconductor device 10 according to each of the fourth to sixth embodiments is mounted on a printed circuit board 1128 via the solder bumps 80 and is coupled electrically to the display unit 1118 and the like by way of the printed circuit board 1128. Also, a radiating substrate 1116, which may be a metallic substrate, is provided on the back side of the semiconductor device 10 (opposite side of the solder balls 80), so that the heat generated from the semiconductor device 10, for example, can be efficiently released outside the first casing 1112 without getting trapped therein.

By employing the semiconductor device 10 according to each of the first to fifth embodiments, the connection reliability of the first device mounting board 110. Thus, the operation reliability as to a portable device, provided with such a semiconductor device 10, according to this sixth embodiment improves.

The present invention is not limited to the above-described embodiments, and it is understood by those skilled in the art that various modifications such as changes in design may be made based on their knowledge and the embodiments added with such modifications are also within the scope of the present invention.

What is claimed is:

1. A device mounting board, comprising:
   a substrate;
   a first insulating layer, provided on one main surface of said substrate, having an opening;
   an electrode portion, provided in the opening, having a top portion protruding above a top surface of said first insulating layer; and
   a second insulating layer provided on top of said first insulating layer in a periphery of the top portion of said electrode portion, said second insulting layer being located apart from the top portion of said electrode portion,
   wherein said electrode portion is shaped such that the top portion of said electrode portion is formed by a curved surface or formed by a curved surface and a plane surface smoothly connected to said curved surface.

2. A device mounting board according to claim 1, wherein the shape of the top portion of said electrode portion is semispherical.

3. A device mounting board according to claim 1, wherein the shape of the top portion of said electrode portion is domy with an uppermost part of the top portion thereof being flat.

4. A device mounting board according to claim 1, wherein an uppermost part of the top portion of said electrode portion is positioned lower than a top surface of said second insulating layer.

5. A device mounting board according to claim 1, wherein an uppermost part of the top portion of said electrode portion is positioned higher than a top surface of said second insulating layer.

6. A device mounting board, comprising:
a substrate;
a wiring layer provided on one main surface of said substrate;
a first insulating layer having an opening where a leading region is exposed, said first insulating layer being so provided as to cover said wiring layer;
a leading portion provided in the opening and electrically connected to said wiring layer;
an electrode portion electrically connected to said leading portion, said electrode portion protruding above a top surface of said first insulating layer over the opening; and
a second insulating layer provided on top of said first insulating layer in a periphery of the top portion of said electrode portion, said second insulting layer being located apart from said electrode portion.

7. A device mounting board according to claim 6, wherein the diameter of said electrode portion is greater than that of the opening, and
a circumferential lower part of said electrode portion is in contact with the top surface of said first insulating layer.

8. A device mounting board according to claim 6, wherein said electrode portion is used as an external connection terminal.

9. A device mounting board according to claim 6, wherein said first insulating layer has another opening where an electrode region of said wiring layer is exposed.

10. A device mounting board according to claim 9, wherein the electrode region is used as a connection terminal for use with an electronic component mounted on a side of one main surface of said substrate.

* * * * *